(12) United States Patent
Yamamoto et al.

(10) Patent No.: US 12,597,584 B2

(45) Date of Patent: Apr. 7, 2026

(54) CHARGED PARTICLE BEAM APPARATUS AND PROCESSOR SYSTEM

(71) Applicant: Hitachi High-Tech Corporation, Tokyo (JP)

(72) Inventors: Akio Yamamoto, Tokyo (JP); Wen Li, Tokyo (JP); Shunsuke Mizutani, Tokyo (JP); Naoya Ishigaki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 437 days.

(21) Appl. No.: 18/131,891

(22) Filed: Apr. 7, 2023

(65) Prior Publication Data

US 2023/0335373 A1 Oct. 19, 2023

(30) Foreign Application Priority Data

Apr. 19, 2022 (JP) ................................. 2022-069048

(51) Int. Cl.
| | |
|---|---|
| *H01J 37/244* | (2006.01) |
| *H01J 37/26* | (2006.01) |
| *H01J 37/28* | (2006.01) |

(52) U.S. Cl.
CPC .......... *H01J 37/244* (2013.01); *H01J 37/265* (2013.01); *H01J 37/28* (2013.01); *H01J 2237/24475* (2013.01); *H01J 2237/2448* (2013.01)

(58) Field of Classification Search
None
See application file for complete search history.

(56) References Cited

U.S. PATENT DOCUMENTS

2012/0273676 A1* 11/2012 Kuijper ..................... G06T 5/50
250/311
2012/0292503 A1* 11/2012 Phifer, Jr. ............. H01J 37/222
250/307

(Continued)

FOREIGN PATENT DOCUMENTS

| JP | 11-37850 A | 2/1999 |
|---|---|---|
| JP | 2015-32392 A | 2/2015 |

(Continued)

OTHER PUBLICATIONS

English machine translation for JP-2015032392-A (Year: 2015).*

*Primary Examiner* — Wyatt A Stoffa

*Assistant Examiner* — Alina Kaliszewski

(74) *Attorney, Agent, or Firm* — MATTINGLY & MALUR, PC

(57) ABSTRACT

There is provided a technique capable of reducing deterioration of a back scattered electron (BSE) detector caused by a dark pulse. Charged particle beam apparatus includes: a plurality of BSE detectors configured to detect a BSE from a sample; and a controller. The controller acquires, within a period, a first peak time of a first peak included in an output signal from a first BSE detector among the plurality of BSE detectors, and a second peak time of a second peak included in an output signal from a second BSE detector other than the first BSE detector among the plurality of BSE detectors, determines, when the second peak is present where a time difference between the first peak time and the second peak time is within a threshold value, that the first peak is caused by the BSE, and determines, when the second peak is not present where the time difference is within the threshold value, that the first peak is caused by the dark pulse.

9 Claims, 22 Drawing Sheets

(56)                    References Cited

U.S. PATENT DOCUMENTS

| | | |
|---|---|---|
| 2015/0076350 A1 | 3/2015 | Plettner et al. |
| 2017/0047192 A1* | 2/2017 | Frosien ................... H01J 37/28 |
| 2019/0088444 A1* | 3/2019 | Attal ...................... G01B 15/02 |
| 2019/0378682 A1* | 12/2019 | Wang ...................... G01T 1/247 |
| 2020/0027694 A1* | 1/2020 | Wang ................. G01N 23/2251 |

FOREIGN PATENT DOCUMENTS

| | | | |
|---|---|---|---|
| JP | 2015032392 A | * | 2/2015 |
| WO | 15/186202 A1 | | 12/2015 |
| WO | 19/080036 A1 | | 5/2019 |

* cited by examiner

*FIG. 1*

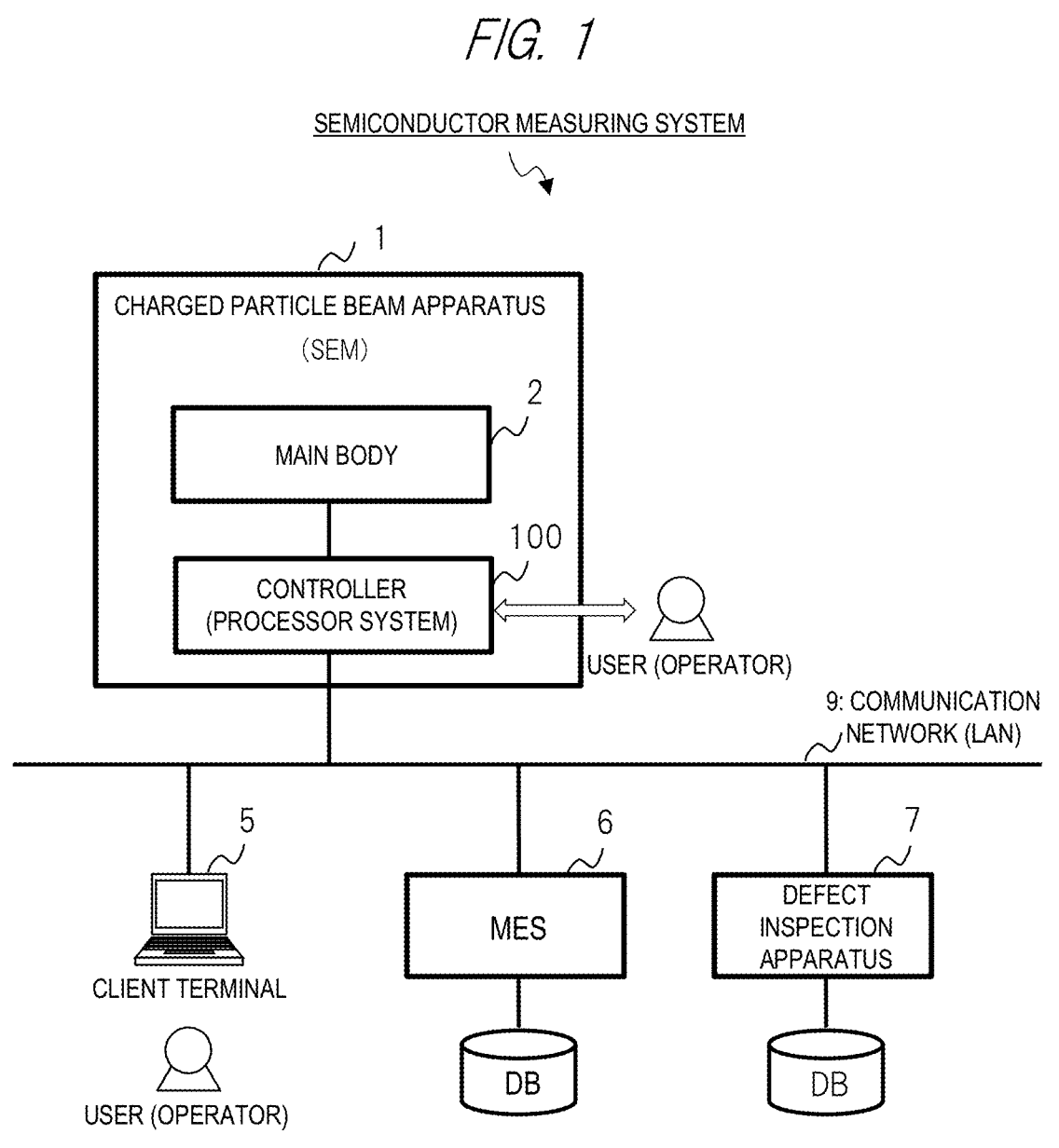

SEMICONDUCTOR MEASURING SYSTEM

1

CHARGED PARTICLE BEAM APPARATUS
(SEM)

2

MAIN BODY

100

CONTROLLER
(PROCESSOR SYSTEM)

USER (OPERATOR)

9: COMMUNICATION
NETWORK (LAN)

5

CLIENT TERMINAL

USER (OPERATOR)

6

MES

DB

7

DEFECT
INSPECTION
APPARATUS

Figure 2:
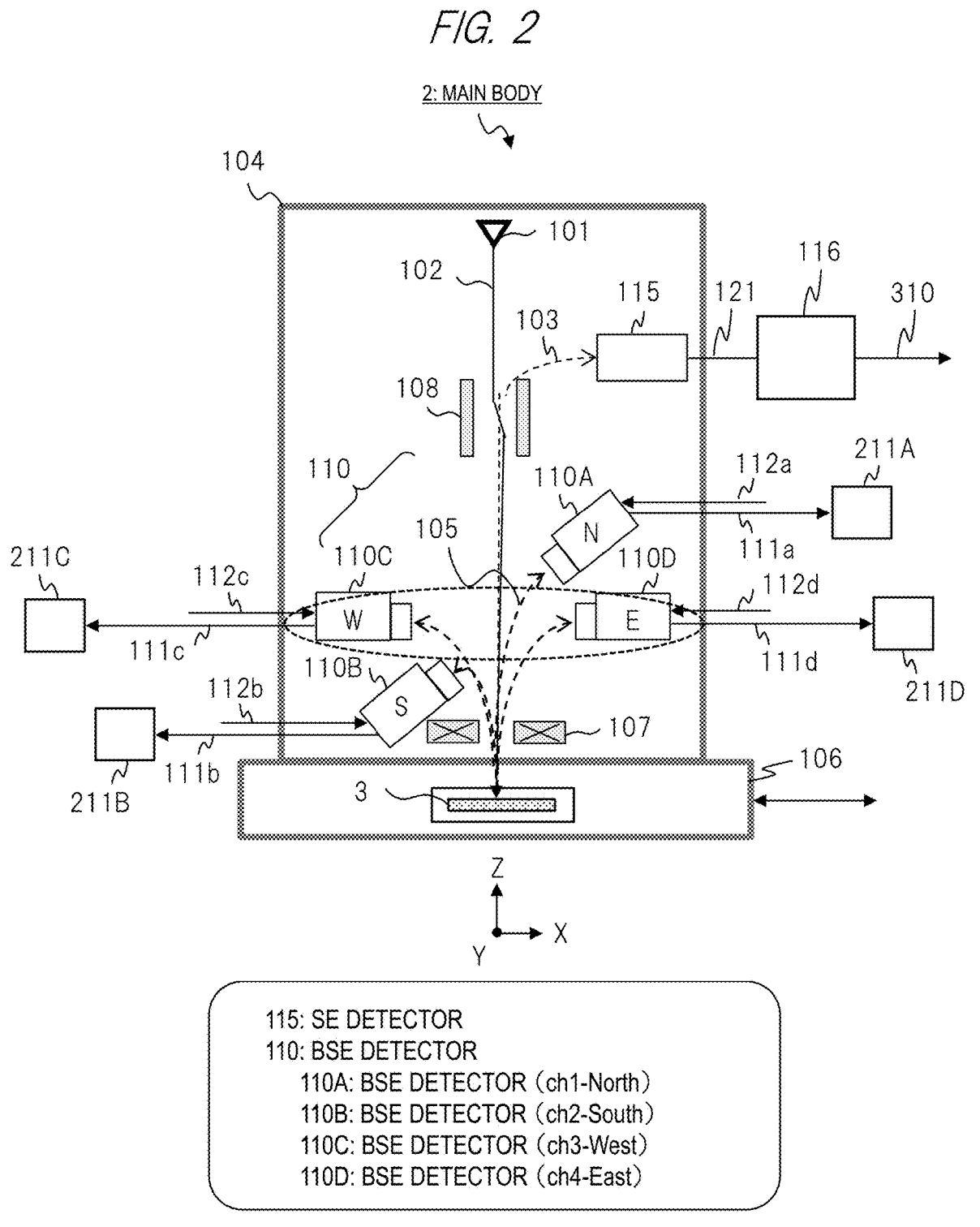

2: MAIN BODY

115: SE DETECTOR
110: BSE DETECTOR
   110A: BSE DETECTOR (ch1-North)
   110B: BSE DETECTOR (ch2-South)
   110C: BSE DETECTOR (ch3-West)
   110D: BSE DETECTOR (ch4-East)

*FIG. 9*
( A )
( B )
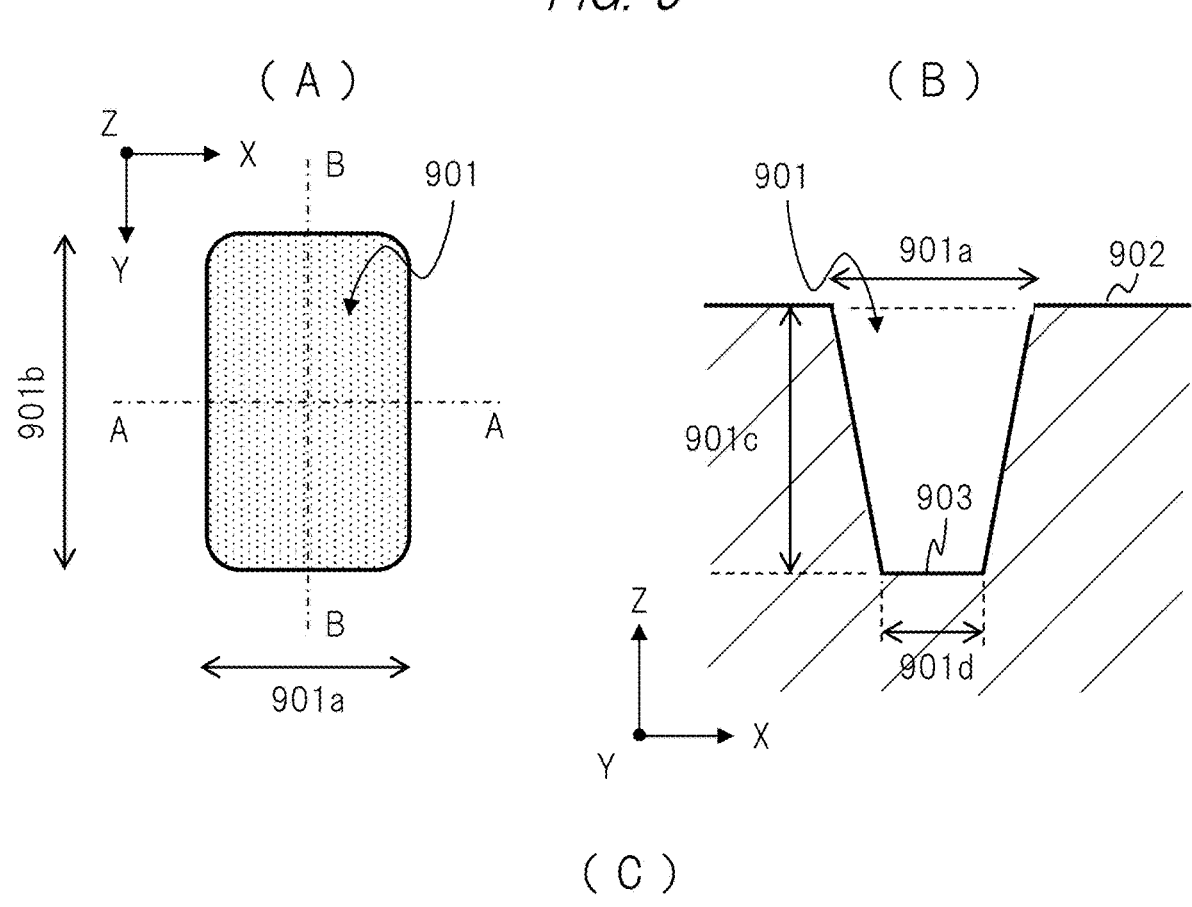
( C )
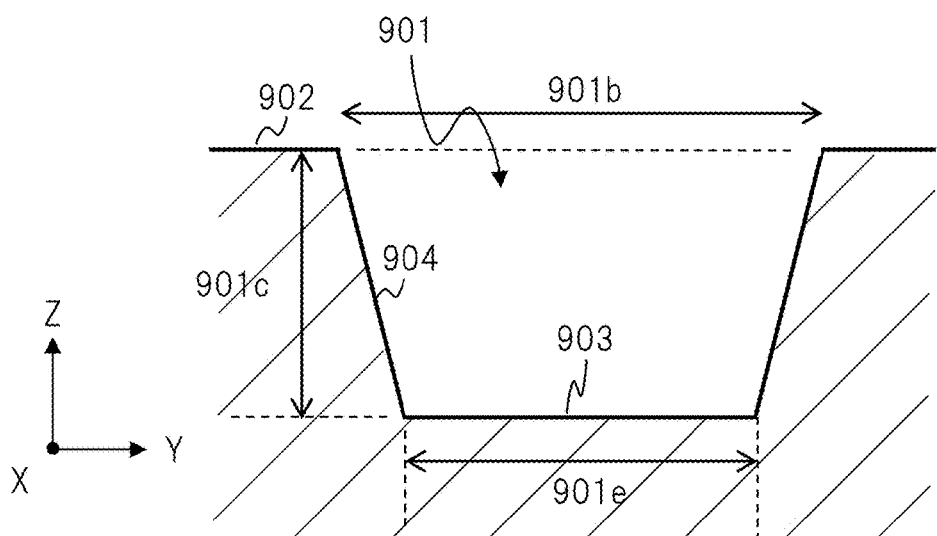

| SAMPLE | PIXEL | WAVEFORM | PEAK POSITION (t) | AMPLITUDE | IMAGE | . . . |
|---|---|---|---|---|---|---|
| S001 | Gc,f,p | W1 | t1 | . . . | . . . | . . . |
| S001 | Gc,f,p | W2 | t2 | . . . | . . . | . . . |
| S001 | Gc,f,p | W3 | t3 | . . . | . . . | . . . |
| . . . | . . . | . . . | . . . | . . . | . . . | . . . |

| COMBINATION | PEAK TIME DIFFERENCE ($\Delta$T) | DETERMINATION REFERENCE VALUE | DETERMINATION RESULT | . . . |
|---|---|---|---|---|
| W1—W2 | $\Delta$T1,2 | $\alpha$ | DARK PULSE | . . . |
| W1—W3 | $\Delta$T1,3 | $\alpha$ | DARK PULSE | . . . |
| W1—W4 | $\Delta$T1,4 | $\alpha$ | DARK PULSE | . . . |
| . . . | . . . | . . . | . . . | . . . |

| ASPECT RATIO D／H | N (110A) | E (110D) | W (110C) | S (110B) |
|---|---|---|---|---|
| . . . | . . . | . . . | . . . | . . . |
| 0.5〜0.7 | 0.4 | 0.1 | 0.1 | 0.4 |
| 0.7〜0.9 | 0.3 | 0.2 | 0.2 | 0.3 |
| 0.9〜1.1 | 0.25 | 0.25 | 0.25 | 0.25 |
| 1.1〜1.3 | 0.2 | 0.3 | 0.3 | 0.2 |
| 1.3〜1.5 | 0.1 | 0.4 | 0.4 | 0.1 |
| . . . | . . . | . . . | . . . | . . . |

FIG. 24

DETERMINATION RESULT (NUMBER OF PULSE SIGNALS DETERMINED TO BE BSE/DARK PULSE (DP))

| ch1 BSE | ch1 DP | ch2 BSE | ch2 DP | ch3 BSE | ch3 DP | ch4 BSE | ch4 DP |
|---------|--------|---------|--------|---------|--------|---------|--------|
| AS | AD | BS | BD | CS | CD | DS | DD |

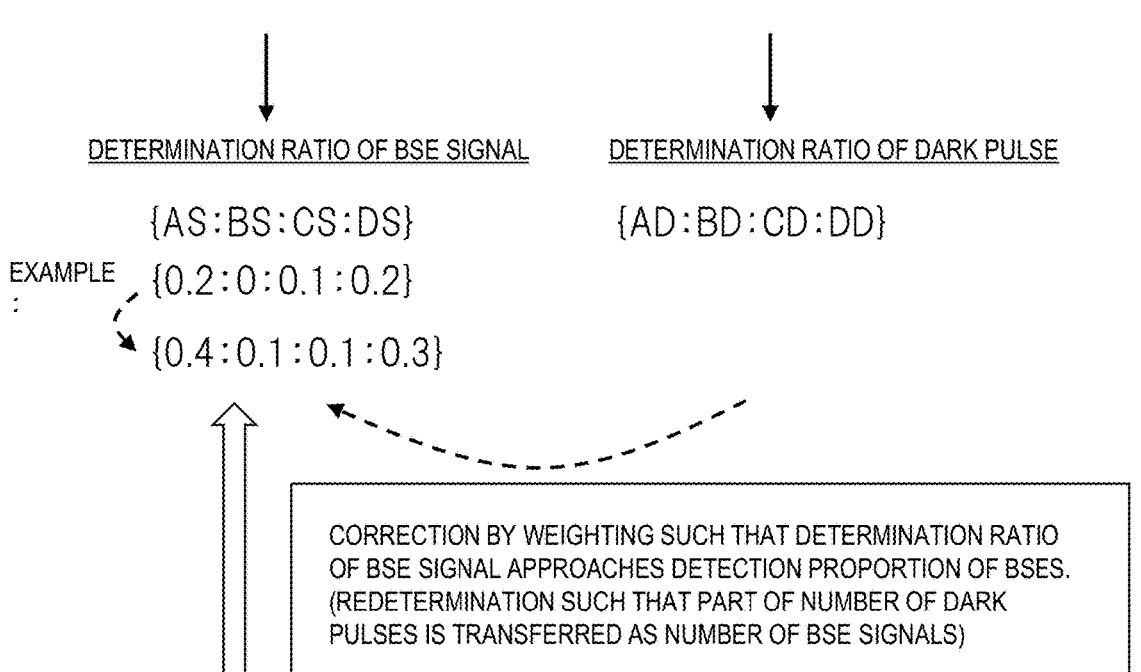

DETERMINATION RATIO OF BSE SIGNAL

{AS:BS:CS:DS}

EXAMPLE： {0.2:0:0.1:0.2}

{0.4:0.1:0.1:0.3}

DETERMINATION RATIO OF DARK PULSE

{AD:BD:CD:DD}

CORRECTION BY WEIGHTING SUCH THAT DETERMINATION RATIO OF BSE SIGNAL APPROACHES DETECTION PROPORTION OF BSES. (REDETERMINATION SUCH THAT PART OF NUMBER OF DARK PULSES IS TRANSFERRED AS NUMBER OF BSE SIGNALS)

DETECTION PROPORTION OF BSE ACCORDING TO STRUCTURE

| N (110A) | E (110D) | W (110C) | S (110B) |
|----------|----------|----------|----------|
| 0.4 | 0.1 | 0.1 | 0.4 |

*FIG. 26*

■ BSE DETECTION FUNCTION 2601     2602    — □ ×

＜SETTING VALUE＞

BSE AND DARK PULSE
DETERMINATION REFERENCE
VALUE:

| PEAK TIME DIFFERENCE | THRESHOLD VALUE (α) | |
|---|---|---|
| ch1 | 20 | ns |
| ch2 | · · · | ns |
| ch3 | · · · | ns |
| ch4 | 20 | ns |

NUMBER (N1) OF BSE
DETERMINATION chs

| 2 | ch |
|---|---|

NUMBER (FD) OF
DETERMINATION FRAMES

| 3 | FRAMES |
|---|---|

＜OUTPUT VALUE＞

S/N VALUE

BEFORE DARK PULSE REMOVAL   | 10 | dB

AFTER DARK PULSE REMOVAL   | 10 | dB

IMAGE OBTAINED
WHEN THERE IS NO
SIGNAL

ACQUIRED
IMAGE

| OK | | Cancel |
|---|---|---|

CHARGED PARTICLE BEAM APPARATUS AND PROCESSOR SYSTEM

CROSS-REFERENCE TO RELATED APPLICATION

The present application claims priority from Japanese application JP2022-069048, filed on Apr. 19, 2022, the contents of which is hereby incorporated by reference into this application.

BACKGROUND OF THE INVENTION

1. Field of the Invention

The present invention relates to a technique of charged particle beam apparatus.

2. Description of Related Art

Charged particle beam apparatus detects signal electrons such as secondary electrons generated by irradiating a sample with a charged particle beam of primary electrons to obtain a microscopic image of the sample. Examples of the charged particle beam apparatus include a scanning electron microscope (SEM). The SEM is used as apparatus for evaluating and measuring a semiconductor device.

In recent years, a structure of a semiconductor device is miniaturized and three-dimensionally processed, and evaluation values required by customers who are semiconductor device manufacturers are diversifying. With the three-dimensionally processing of the device structure, there is a need to measure a shape dimension of a structure such as a hole or a groove on a semiconductor substrate surface with high accuracy in order to improve yield. The dimension to be measured includes a dimension in a height and depth direction (for example, a vertical direction) of a sample, a bottom dimension in an in-plane direction (for example, a horizontal direction) of the sample, and the like.

In measurement using the SEM, when the sample surface is irradiated with a charged particle beam of primary electrons, signal electrons having various energies due to interaction between the primary electrons and the sample are emitted in various directions. The signal electrons include different information on the sample depending on an emission energy and an emission angle. Discrimination and detection of the signal electrons are indispensable for various measurements. The fact that the signal electrons include information means that such information can be obtained by examining the signal electrons detected as an image or a waveform.

In general, signal electrons emitted with an energy of 50 eV or less are called secondary electrons (which may be referred to as SE). Signal electrons emitted with an energy larger than an energy of the secondary electrons and close to an energy of the primary electrons are called back scattered electrons (which may be referred to as BSE). The signal electrons are distinguished.

The secondary electrons are sensitive to a surface shape or electric potential of the sample, and are effective for measuring a dimension of a surface structure such as a pattern width of a semiconductor device structure. However, the secondary electrons are difficult to escape from a three-dimensional structure such as a hole or a groove because the secondary electrons are absorbed by side walls of the structure, making detection and measurement difficult.

Meanwhile, the back scattered electrons include information on a composition and a three-dimensional shape of the sample, and information such as a three-dimensional structure or a difference in composition between a surface and a bottom of the sample can be obtained. In addition, since the back scattered electrons have high energy, the back scattered electrons easily escape from a bottom of a hole or groove structure through side walls, and signal electrons from the bottom of the structure can be detected and measured.

As an example in the related art, US2019/0088444 describes a back scattered electron detector (a BSE detector) or the like that detects back scattered electrons. A large angle detector 25 in FIG. 2 includes four segments 251 to 254.

CITATION LIST

Patent Literature

PTL 1: US2019/0088444

SUMMARY OF THE INVENTION

The back scattered electron detector (which may be referred to as a BSE detector) includes, for example, a scintillator, a photomultiplier (a photomultiplier tube), and a semiconductor photodetector. The scintillator is a device that detects back scattered electrons and converts the back scattered electrons into photons. The photomultiplier or the semiconductor photodetector is a device that converts the generated photons into a back scattered electron signal (which may be referred to as a BSE signal) which is a pulse waveform.

The waveform of the BSE signal is a pulse-shaped signal with a high rising edge of, for example, about 10 ns and a low falling edge of, for example, about 100 ns. The semiconductor photodetector used in the BSE detector generates a dark current, which is noise, even in the absence of incident photons. The dark current, which is noise, is also called a dark pulse, dark noise, dark count, or the like.

The dark pulse is difficult to distinguish from the waveform of the BSE signal. Therefore, in an SEM in the related art, a signal-to-noise ratio (which may be referred to as S/N) of a detection image deteriorates due to the dark pulse generated in the BSE detector. When the S/N deteriorates, detailed information on the three-dimensional structure such as a hole or a groove cannot be obtained, length measurement accuracy deteriorates, and a machine difference increases.

An object of the invention is to provide a technique capable of reducing deterioration of a BSE detector caused by a dark pulse, in other words, a technique capable of achieving improvement in measurement accuracy or the like, in relation to the technique of the charged particle beam apparatus.

A representative embodiment of the disclosure includes the following configuration. Charged particle beam apparatus according to the embodiment is charged particle beam apparatus including: a plurality of back scattered electron (BSE) detectors configured to detect a BSE from a sample; and a controller. In order to determine whether a first peak included in an output signal from a first BSE detector among the plurality of BSE detectors is caused by a BSE or a dark pulse, the controller acquires a first peak time of the first peak within a period, acquires, within the period, a second peak time of a second peak included in an output signal from a second BSE detector other than the first BSE detector among the plurality of BSE detectors, determines, when the second peak is present where a time difference between the first peak time and the second peak time is within a threshold value, that the first peak is caused by the BSE, and determines, when the second peak is not present where the time difference between the first peak time and the second peak time is within the threshold value, that the first peak is caused by the dark pulse.

According to the representative embodiment of the disclosure, deterioration of the BSE detector caused by the dark pulse can be reduced, in other words, improvement in measurement accuracy or the like can be achieved, in relation to the technique of the charged particle beam apparatus. Problems, configurations, effects, and the like other than those described above are shown in the embodiments for carrying out the invention.

BRIEF DESCRIPTION OF THE DRAWINGS

FIG. 1 shows a configuration example of an entire system (semiconductor measuring system) including charged particle beam apparatus (for example, an SEM) according to a first embodiment;

FIG. 2 shows a configuration example of a main body of the charged particle beam apparatus (for example, an SEM) according to the first embodiment;

FIGS. 9A to 9C show an example of a structure of the sample in the first embodiment;

FIGS. 10A to 10C show an example of emission of secondary electrons and back scattered electrons with respect to incidence of primary electrons on the structure of the sample in the first embodiment;

FIG. 15 shows an example of data and information to be stored in the first embodiment;

FIG. 24 shows an example of correction by weighting on determination result in the fourth embodiment;

FIG. 26 shows a screen example of a GUI applicable to each embodiment.

DESCRIPTION OF EMBODIMENTS

Figures 3, 4:
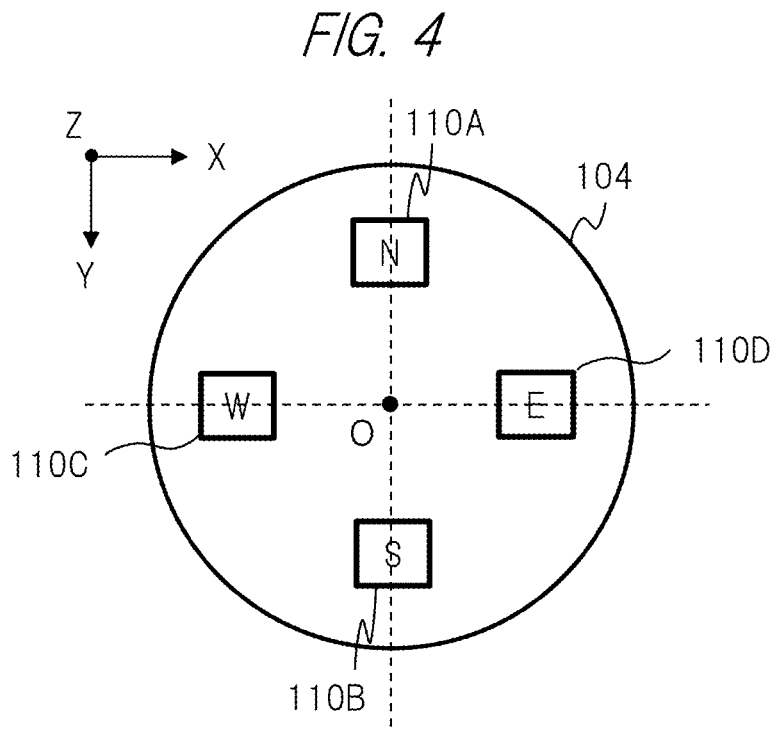
FIG. 3 is a schematic explanatory diagram showing scanning of a sample with a primary electron beam of the SEM in the first embodiment.
FIG. 4 is a schematic explanatory diagram showing an arrangement of a plurality of BSE detectors in the SEM in the first embodiment.

Hereinafter, embodiments of the disclosure will be described in detail with reference to the drawings. In the drawings, the same parts are denoted by the same reference signs in principle, and a repeated description thereof will be omitted. In order to facilitate understanding, in the drawings, representations of components may not represent an actual position, size, shape, range, and the like.

For the purpose of description, when processing performed using a program is described, the description may be made with reference to programs, functions, processing units, and the like. However, a primary hardware regarding the programs, the functions, the processing units and the like is a processor, or a controller, apparatus, a computer, a system, or the like including the processor, and the like. The computer performs processing according to a program read onto a memory while appropriately using resources such as a memory and a communication interface by the processor. Accordingly, functions, processing units, and the like are implemented. The processor includes, for example, a CPU or a semiconductor device such as a GPU. The processing is not limited to software program processing, and can be implemented by a dedicated circuit. FPGA, ASIC, CPLD and the like can be applied to the dedicated circuit.

The program may be installed as data in a target computer in advance, or may be distributed and installed as data into the target computer from a program source. The program source may be a program distribution server on a communication network, and may be a non-transient computer-readable storage medium (for example, a memory card). The program may include a plurality of modules. A computer system may be implemented by a plurality of types of apparatus. The computer system may include a client server system, a cloud computing system, an IoT system, or the like. Various types of data and information include, for example, a structure such as a table and a list, but are not limited thereto. Identification information can be replaced with an identifier, an ID, a name, a number, or the like.

Solution

With respect to a dark pulse that can be generated in a BSE detector, charged particle beam apparatus according to an embodiment enables discrimination and detection between the dark pulse and a BSE signal.

The charged particle beam apparatus according to the embodiment is a system using a plurality of BSE detection systems (which may be referred to as channels) for BSE detection, and includes, for example, a plurality of BSE detectors (in other words, a plurality of BSE detection units) as a BSE detector. The BSE detectors each include, for example, a scintillator and a semiconductor photodetector.

Depending on a shape and a structure of a target sample such as a semiconductor wafer, a plurality of BSEs are generated according to the number of primary electrons emitted within a certain fixed time (i). Therefore, in the system using the plurality of BSE detection systems, photons are incident on the semiconductor photodetectors of the plurality of BSE detectors almost simultaneously. Accordingly, in the plurality of BSE detection systems, a pulse-shaped BSE signal with a high rising edge of, for example, about 10 ns and a low falling edge of, for example, about 100 ns is received.

When the BSE signal is received, a dark pulse, which is noise, is randomly generated. The embodiment focuses on randomness of the dark pulse. In the system including the charged particle beam apparatus according to the embodiment, when a pulse signal is received by, for example, a plurality of BSE detectors within the certain fixed time $\tau$, the pulse signal is estimated and determined to be caused by a BSE and be a BSE signal. Meanwhile, when a pulse signal is received by, for example, only a single BSE detector within the certain fixed time $\tau$, the pulse signal is estimated and determined to be caused by a dark pulse and be a dark pulse. The present system removes the estimated and determined dark pulse from the detection signal.

The controller of the charged particle beam apparatus according to the embodiment examines pulse waveforms of C output signals, in other words, detection signals, of C BSE detectors among all C BSE detectors within a time T for the same pixel corresponding to a target position on a sample surface. The controller estimates and determines that when pulse signals are received and appear almost simultaneously in output signals from a first number (N1, a setting value in a range of 2 to C) or more BSE detectors among all the C BSE detectors, the pulse signal is caused by the BSE, in other words, the pulse signal is the BSE signal.

The controller estimates and determines that, for a target pixel, when no pulse signal is received and appears almost simultaneously in the output signals from the first number N1 or more BSE detectors among the C output signals from the C BSE detectors within the time T, in other words, when a pulse signal is received and appears almost simultaneously in output signals from less than first number N1 BSE detectors among the C output signals from the C BSE detectors within the time T, the pulse signal is caused by the dark pulse, in other words, the pulse signal is the dark pulse. For example, in a first embodiment, it is determined that, when only a pulse signal of an output signal from one BSE detector is received, the pulse signal is the dark pulse.

The time T is a determination target period corresponding to the fixed time $\tau$ described above, and is, for example, a one pixel period corresponding to the target pixel. The time T can be set by design or by user settings. The time T may be a range period of a plurality of pixels including pixels around the target pixel as a time center, or may be a one frame period corresponding to an image including the target pixel.

In other words, the pulse signal is a peak waveform and is represented by a peak position and a peak time.

The above determination is described as a determination with a condition to determine the BSE signal. Conversely, the determination condition can be described as a condition to determine the dark pulse. This case is as follows. The controller of the charged particle beam apparatus according to the embodiment determines, for the target pixel, whether pulse signals are received and appear almost simultaneously in the output signals from the less than first number N1 BSE detectors among the C output signals from the C BSE detectors within the time T. When such a condition is satisfied, the controller estimates and determines that the pulse signal is caused by the dark pulse, in other words, the pulse signal is the dark pulse.

In the above determination, the determination that the pulse signals are received and appear almost simultaneously is, more specifically, for example, a determination as to whether a time difference in the peak position between the pulse signals from each BSE detector is within a threshold value. The threshold value of the time difference in the peak position can also be set by design or by user settings as one of determination reference values. In other words, the determination is as follows. It is determined that when, among the output signals from the BSE detectors, the number of output signals from BSE detectors for which the time difference in the peak position between the pulse signals is within the threshold value is equal to or greater than the first number N1, the corresponding pulse signal is the BSE signal.

The first number N1, which is one of the determination reference values for determining the discrimination between the BSE signal and the dark pulse, can be set by design or by user setting. In the first embodiment, for example, C=4 and N1=2. Alternatively, N1=3, 4, or the like may be used. For example, when C=4 and N1=4, the determination can be described as follows. The controller of the charged particle beam apparatus according to the embodiment determines that, for the target pixel, when pulse signals are received and appear almost simultaneously in the output signals from all the C BSE detectors among the C output signals from all the C BSE detectors within the time T, the pulse signal is the BSE signal, and determines, when a pulse signal is received and appears only in the output signals from the less than C BSE detectors, that the pulse signal is the dark pulse.

First Embodiment

Charged particle beam apparatus according to the first embodiment of the disclosure will be described with reference to FIGS. 1 to 14. In the first embodiment and the like below, an example of application to an SEM as the charged particle beam apparatus will be described. The invention is not limited thereto, and the embodiment can be similarly applied to other types of apparatus as long as the apparatus includes a BSE detector. In the following, a case will be described in which the SEM is used to measure a height, depth, or bottom dimension, for example, a critical dimension of a pattern, for a three-dimensional structure such as a hole or a groove on the surface of a semiconductor device, which is a sample. The invention is not limited thereto, and the embodiment can be similarly applied to observation, evaluation, inspection, and the like of a sample.

Semiconductor Measuring System

FIG. 1 shows a semiconductor measuring system as a configuration example of an entire system including charged particle beam apparatus 1 according to the first embodiment. In the semiconductor measuring system in FIG. 1, the charged particle beam apparatus 1, a client terminal 5, a manufacturing execution system (MES) 6, and defect inspection apparatus 7 are connected to a communication network 9 such as a LAN. The charged particle beam apparatus 1 is, for example, an SEM, and includes a main body 2 and a controller 100. The controller 100 is a processor system that controls the main body 2 and executes processing. A user such as an operator operates the SEM 1 by operating the controller 100. Although the MES 6 and the defect inspection apparatus 7 are shown as an example of external apparatus for the charged particle beam apparatus 1, the invention is not limited thereto.

The client terminal 5 is information processing terminal apparatus such as a PC connected to the communication network 9 and capable of communicating with the controller 100 and the like of the SEM 1 through the communication network 9. The user such as an operator can operate the client terminal 5 to access the controller 100 or the like and remotely use functions of the SEM 1 or the like.

The MES 6 is a system that executes and manages manufacture of the semiconductor device, and includes, for example, design information of the semiconductor device, which is a sample, and management information of a manufacturing flow. The defect inspection apparatus 7 inspects a defect of the semiconductor device, which is a sample, and includes an inspection result as defect detection information. The defect detection information includes information indicating a position of the detected defect on the sample surface. The charged particle beam apparatus 1 may refer to the defect detection information from the defect inspection apparatus 7 and observe a defect position on the sample surface, which is indicated by the defect detection information. Another example of the external apparatus is semiconductor manufacturing apparatus such as etching apparatus. The controller 100 may appropriately refer to necessary data and information from the external apparatus such as the MES 6, or may output data and information to the external apparatus.

SEM

FIG. 2 shows a configuration example of the main body 2 of the SEM 1. The main body 2 includes a column 104 which is an electron microscope column, a stage mechanism 106, an electron gun 101, deflectors 108, objective lenses 107, an SE detector 115, four BSE detectors 110A to 110D as a BSE detector 110, and the like. An optical axis of the electron gun 101 is disposed on a Z axis corresponding to the vertical direction.

A sample 3 is placed and fixed on a stage which is a sample stage of the stage mechanism 106. A movement of the stage of the stage mechanism 106 is driven and controlled by the controller 100. The stage can be moved at least in the horizontal direction which is an X axis direction and a Y axis direction, but the invention is not limited thereto.

The electron gun 101, the deflectors 108, the objective lenses 107, and the like are disposed inside the column 104 having a vacuum environment. A primary electron beam formed by primary electrons 102 is emitted from the electron gun 101 under conditions of a voltage Vx and a current Ix. The emitted primary electron beam flies along a beam optical axis in a downward direction of the Z axis. A trajectory of the primary electron beam is adjusted by the deflectors 108, and the primary electron beam is converged on the surface of the sample 3 by the objective lenses 107. At this time, a negative voltage is applied to the sample 3, and the primary electrons 102 of the primary electron beam collide with the sample 3 with an energy smaller than an energy generated by the electron gun 101. By the collision of the primary electrons, back scattered electrons 105 and secondary electrons 103 are generated from the sample 3.

Scanning

FIG. 3 is a schematic explanatory diagram showing scanning of the surface of the sample 3 with the primary electron beam. The surface of the sample 3, in other words, a front surface or an upper surface of the sample 3 is assumed to be an X-Y plane including an X axis and a Y axis. In order to acquire information on the sample 3, the primary electrons 102 are sequentially scanned over the surface of the sample 3 as shown in FIG. 3. The present example shows a case of line sequential scanning in which line scanning along the X axis is repeated in the Y axis direction. On the X-Y plane of the sample 3, there are a plurality of target positions for measurement or the like, and each target position corresponds to a respective one of pixels in a detection image. Each pixel is also referred to as a target pixel. For example, a pixel 30 at a certain target position is represented by two-dimensional position coordinates (x, y) in the detection image. The pixel 30 at the target position includes time information corresponding to a scanning time point. The X-Y plane, which is the surface of the sample 3 on the stage, is basically irradiated with the primary electron beam from the direction of the Z axis, which is the vertical direction, but the invention is not limited thereto. For example, an oblique direction with respect to the Z axis, in other words, a tilt direction may be set as the optical axis for beam irradiation.

The BSE detector 110 in FIG. 2 is a detector that mainly detects the back scattered electrons 105. The BSE detector 110 includes the BSE detectors 110A, 110B, 110C, and 110D as four BSE detectors of four channels, in other words, four detection systems. FIG. 2 schematically shows an arrangement position of the four BSE detectors 110A to 110D, and actually, the four BSE detectors 110A to 110D are disposed at the same height in a plane in the Z axis as shown in FIG. 4.

Arrangement of Plurality of BSE Detectors

FIG. 4 is a schematic explanatory diagram showing an example of the arrangement of the four BSE detectors 110A to 110D, and shows an X-Y plane when a horizontal cross section of the column 104 is viewed from above. The column 104 or the like has, for example, a cylindrical shape as an axisymmetric shape with respect to the Z axis. As shown in FIG. 4, the four BSE detectors 110A to 110D are disposed at the same height in the plane at positions of north, south, east, and west which have a relationship of being separated by 90 degrees on a circumference at a certain radius around a point O corresponding to the Z axis. The BSE detector 110A is disposed at the north (N) position as a first channel ch1. The BSE detector 110B is disposed at the south (S) position as a second channel ch2. The BSE detector 110C is disposed at the west (W) position as a third channel ch3. The BSE detector 110D is disposed at the east (E) position as a fourth channel ch4. The number and arrangement position of the BSE detectors 110 are not limited thereto.

The number of channels of the BSE detector 110 is C. C is the number of channels which are the BSE detection systems, and C=4 in the present example. The number of scanning frames is F. F is the number of frames scanned as shown in FIG. 3 for each target pixel at the target position. In the present example, F is the number of 2 or more. The number of pixels in each frame is P. P is the number of all pixels in the image corresponding to the frame. Among the number of channels C, the number of a channel of interest is denoted by c. Among the number of scanning frames F, an order of a frame of interest, in other words, an order from a first frame is denoted by f. Among the number of pixels P, an order of a pixel of interest, in other words, an order from a first pixel is denoted by p. $1 \leq c \leq C$, $1 \leq f \leq F$, and $1 \leq p \leq P$. A certain pixel is denoted by G. In FIG. 3, the pixel G in a certain order in a certain frame f in a certain channel c can be expressed by (Gc,f,p). As an example, (G2,15,50) is a 50th pixel in a 15th frame in the second channel ch2.

In FIG. 2, the back scattered electrons 105 and the secondary electrons 103 generated from the sample 3 by the collision of the primary electrons 102 fly through the column 104 according to the emission energies and emission angles of the back scattered electrons 105 and the secondary electrons 103. The SE detector 115 is a detector that mainly detects the secondary electrons 103. The SE detector 115 is disposed at a position where the secondary electrons 103 are easily captured, for example, at a position higher than a height position of the BSE detector 110. The BSE detector 110 is a detector that mainly detects the back scattered electrons 105. The four BSE detectors 110A to 110D, which are the BSE detector 110, are disposed at positions where the back scattered electrons 105 are easily captured, for example, at certain height positions.

The four BSE detectors 110A to 110D are disposed in the column 104, and are disposed at an equal distance from the beam optical axis and at right angles to each other as shown in FIG. 4. With such an arrangement, the back scattered electrons 105 generated on the front surface of the sample 3 are input to the four BSE detectors 110 as the ch1 to ch4 with substantially equal probability. In the configuration of the BSE detector 110, when the voltage Vx and the current Ix of the electron gun 101 are sufficiently high, the back scattered electrons 105 are input to and received by all the BSE detectors 110 of the four channels since the number of generated back scattered electrons 105 is sufficiently large. On the other hand, when the voltage Vx and the current Ix of the electron gun 101 are low, or when the position where the sample 3 is irradiated with the primary electrons 102 has a structure such as a deep hole or a groove, the back scattered electrons 105 are input to and received by the BSE detectors 110 of a smaller number of channels, for example, 2 or 3 channels.

BSE Detector

Figure 5:
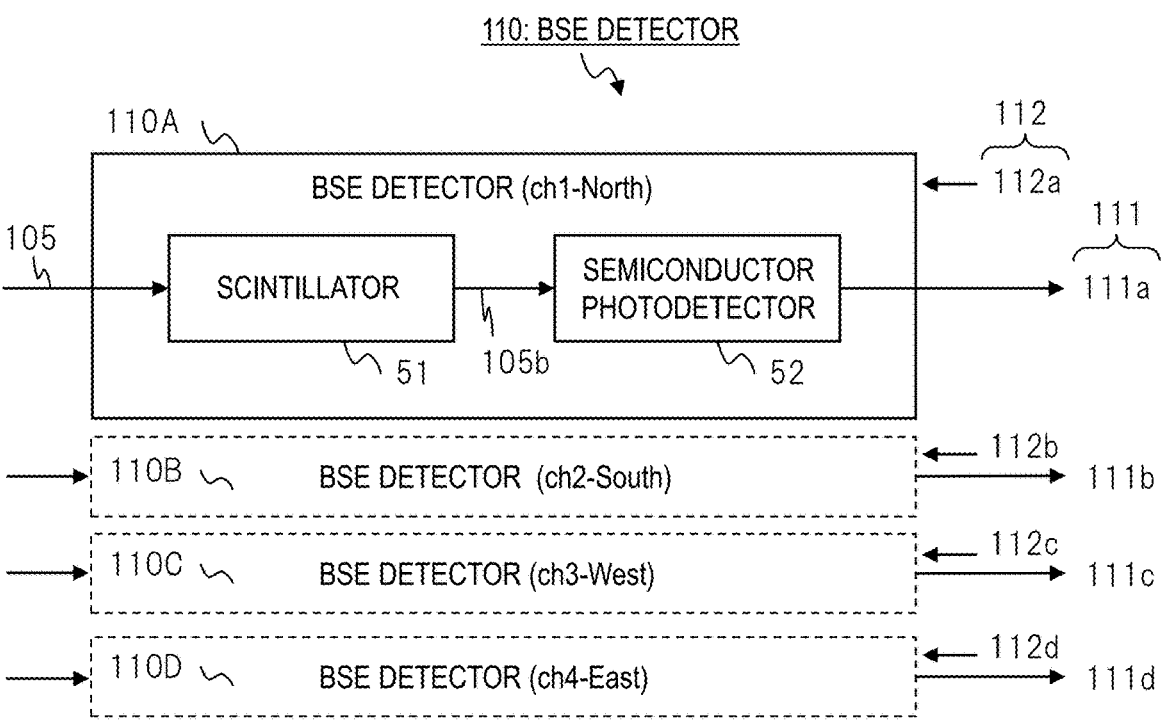
FIG. 5 shows a configuration example of the BSE detector in the first embodiment.

FIG. 5 shows a configuration of each BSE detector 110 in the first embodiment. In the first embodiment, the BSE detectors 110 each include a scintillator 51 and a semiconductor photodetector 52. FIG. 5 shows a configuration of the BSE detector 110A as the first channel ch1, and other BSE detectors as other channels have the same configuration. The BSE detectors 110 are driven and controlled based on control voltages 112 (112a to 112d) from the controller 100. When the back scattered electrons 105 collide with the scintillator 51 of each BSE detector 110, the back scattered electrons 105 are converted into photons 105b. The converted photons 105b are converted into a BSE detection signal 111 by the semiconductor photodetector 52 of each BSE detector 110.

The BSE detection signals 111 (111a to 111d) output from the BSE detectors 110 (110A to 110D) are transmitted to the BSE detection circuits 211 (211A to 211D). The BSE detection circuits 211 include the BSE detection circuits 211A to 211D corresponding to each channel.

BSE Detection Circuit

Figure 6:
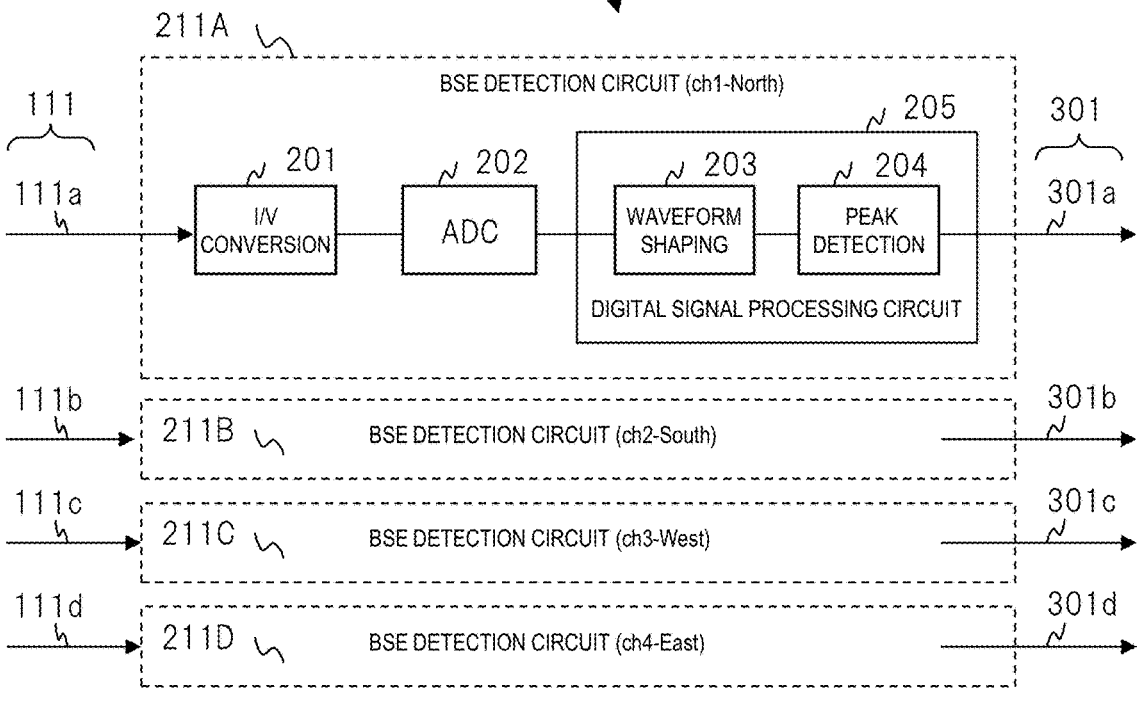
FIG. 6 shows a configuration example of a BSE detection circuit in the first embodiment.

FIG. 6 shows a configuration example of the BSE detection circuits 211 (211A to 211D). FIG. 6 shows a configuration of the BSE detection circuit 211A of the first channel ch1 (North), and other BSE detection circuits of other channels have the same configuration. The BSE detection circuits 211 each include, in order from an input side, an I/V conversion circuit 201, an ADC 202, and a digital signal processing circuit 205. The I/V conversion circuit 201 converts a current signal corresponding to the input detection signal 111 into a voltage signal. The ADC 202 converts an analog signal, which is the voltage signal, into a digital signal.

The digital signal processing circuit 205 includes a waveform shaping circuit 203 and a peak detection circuit 204. The waveform shaping circuit 203 shapes a waveform of the digital signal into a waveform whose peak can be easily detected by the peak detection circuit 204 in the subsequent stage. Specifically, since the waveform of the digital signal based on the BSE detection signal 111 is the waveform whose fall is slower than rise as described above, the shaping is performed so as to accelerate the fall. The peak detection circuit 204 detects a peak corresponding to the pulse waveform based on the shaped waveform signal. The peak is expressed and identified by, for example, a peak time, in other words, a peak position. Signals 301 (301a to 301d) output from the BSE detection circuits 211 are transmitted to the controller 100 and processed by a processing unit 300 (FIG. 8) of the controller 100.

Meanwhile, the secondary electrons 103 are captured by the SE detector 115 in FIG. 2. The SE detector 115 converts the secondary electrons 103 into a detection signal 121 and outputs the detection signal 121. The output detection signal 121 is transmitted to an SE detection circuit 116. The SE detection circuit 116 obtains a signal 310 which is an SE detection signal based on the detection signal 121. The output signal 310 is transmitted to the controller 100 and processed by the processing unit 300 (FIG. 8) of the controller 100.

Controller

Figure 7:
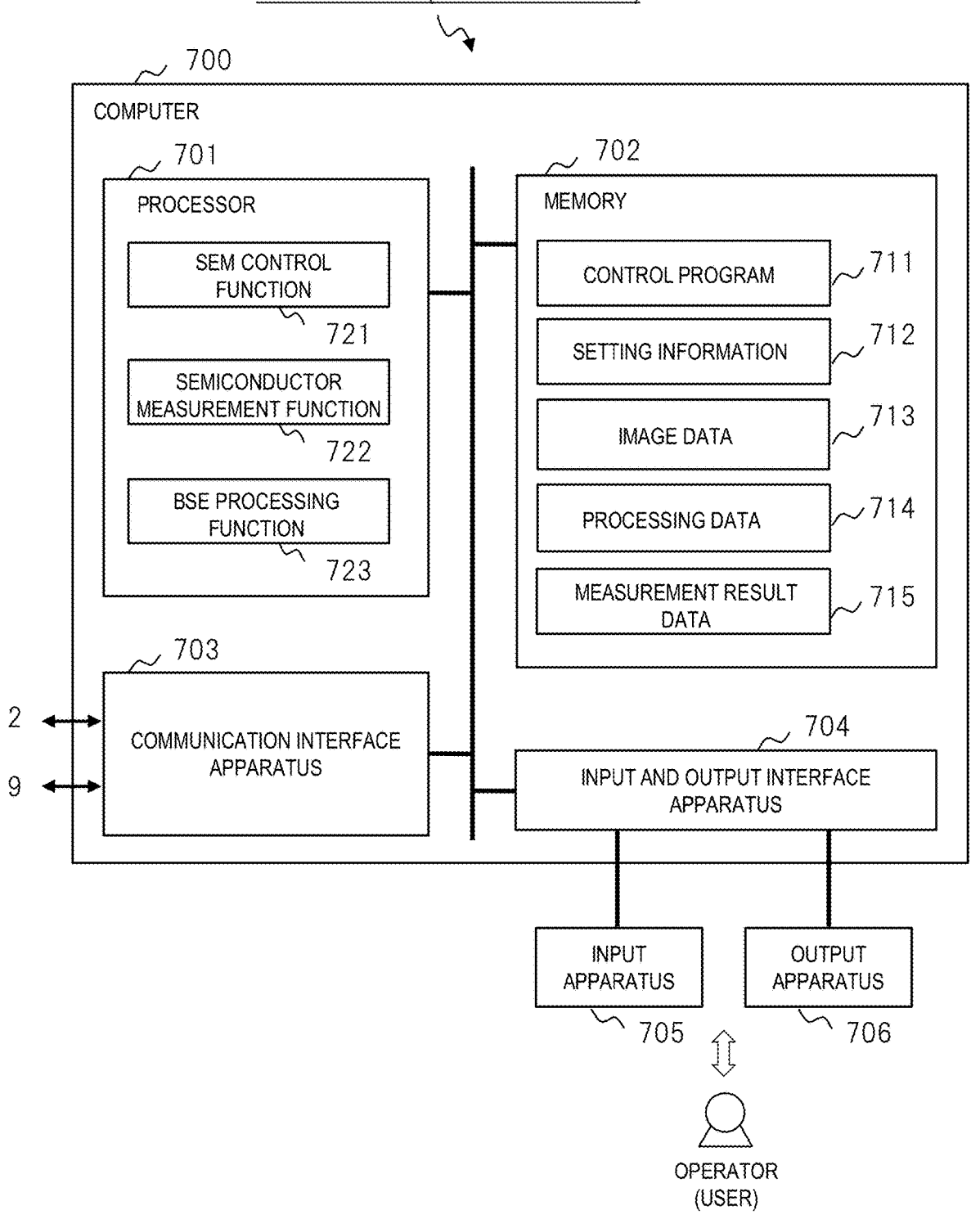
FIG. 7 shows a configuration example of a processor system which is a controller of the SEM in the first embodiment.

FIG. 7 shows a configuration example of hardware and software as a configuration example of a processor system which is the controller 100. The controller 100 mainly includes a computer 700. The computer 700 includes a processor 701, a memory 702, communication interface apparatus 703, and input and output interface apparatus 704. The components are connected to a bus and can communicate with each other. Input apparatus 705 and output apparatus 706 are externally connected to the computer 700 via the input and output interface apparatus 704.

Figure 8:
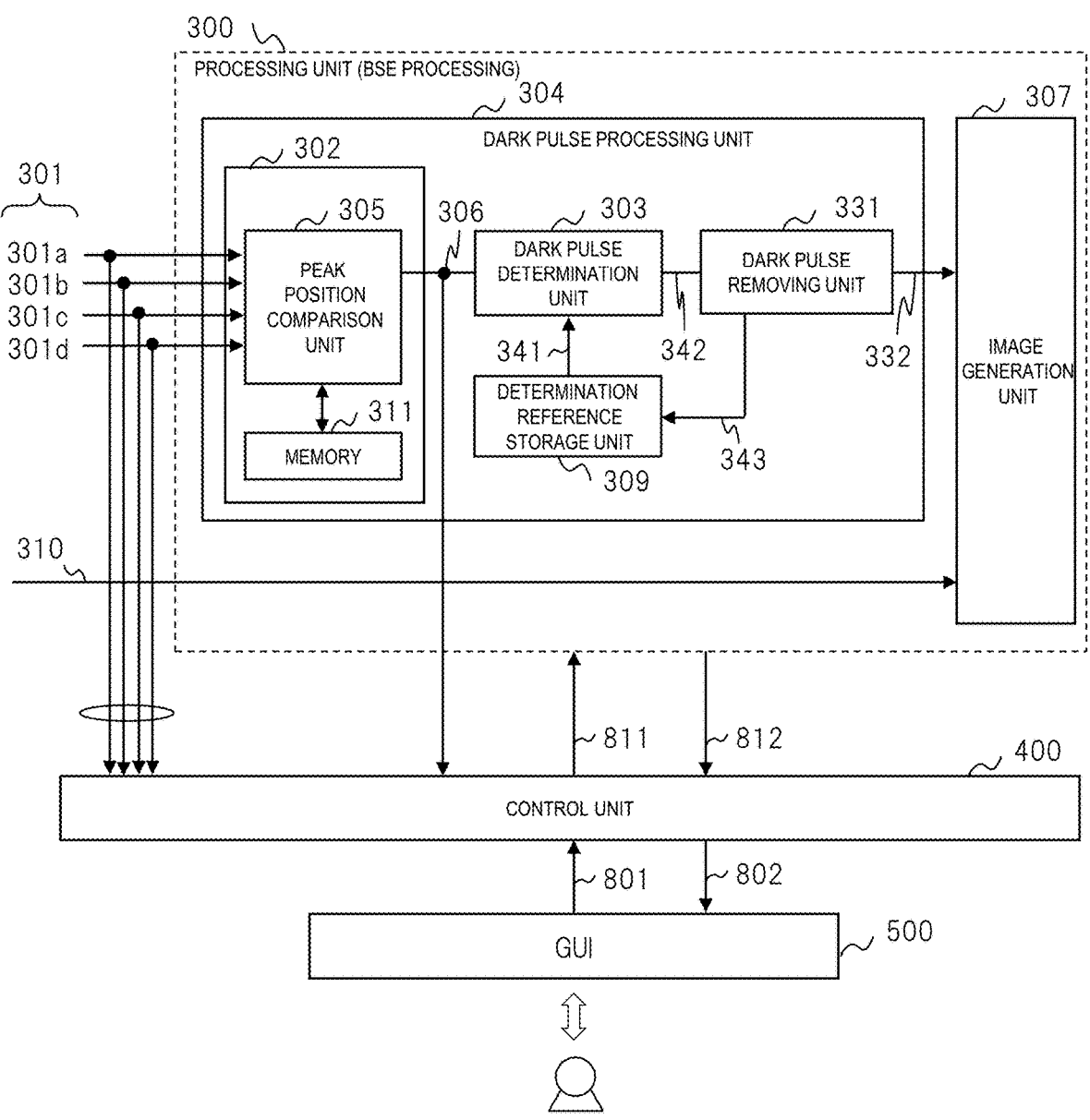
FIG. 8 shows a configuration example of a processing unit provided in the controller in the first embodiment.

The processor 701 is implemented by a CPU and a semiconductor device such as an MPU or a GPU. The processor 701 includes ROM, RAM, various peripheral functions, and the like. The processor 701 executes processing according to a control program 711 of the memory 702. Accordingly, functions such as an SEM control function 721, a semiconductor measurement function 722, and a BSE processing function 723 are implemented. The SEM control function 721 is a function of controlling the main body 2 of the SEM 1. The semiconductor measurement function 722 is a function of measuring the dimension of the pattern of the sample 3 as a function of the semiconductor measuring system. The BSE processing function 723 is a function of discriminating between the dark pulse and the BSE signal based on the BSE detection signal and generating an image from which the dark pulse is removed, corresponding to the processing unit 300 to be described later (FIG. 8). The semiconductor measurement function 722 measures the dimension of the pattern of the semiconductor device using a processing result from the BSE processing function 723. Accordingly, high accuracy can be achieved in relation to measurement.

The memory 702 stores the control program 711, setting information 712, image data 713, processing data 714, measurement result data 715, and the like. The control program 711 is a program for implementing each function by causing the processor 701 to execute processing. The setting information 712 is system setting information or user setting information of each function. The image data 713 is data of a detection image or a generation image acquired from the SEM 1. The processing data 714 is data generated in the process of processing each function. The measurement result data 715 is data including a measured dimension and the like, which is obtained as a processing result by the semiconductor measurement function 722.

The communication interface apparatus 703 is apparatus including a communication interface for the main body 2 of the SEM 1, the communication network 9, and the like. The input and output interface apparatus 704 is apparatus including an input and output interface, and the input apparatus 705 and the output apparatus 706 are externally connected to the input and output interface apparatus 704. Examples of the input apparatus 705 include a keyboard and a mouse. Examples of the output apparatus 706 include a display and a printer. The input apparatus 705 and the output apparatus 706 may be incorporated in the processor system which is the controller 100. The user such as an operator may use the controller 100 by operating the input apparatus 705 or displaying a screen on the output apparatus 706. The user may use the SEM 1 by accessing the controller 100 from the client terminal 5 in FIG. 1 through the communication network 9.

External storage apparatus (for example, a memory card or a disk) may be connected to the controller 100, and input and output data of the controller 100 may be stored in the external storage apparatus. The controller 100 may input and output data to and from external server apparatus or the like through communication.

When using a function in client server communication between the controller 100 of the SEM 1 in FIG. 1 and the client terminal 5 of the user, the function can be implemented as follows, for example. The user accesses a server function of the controller 100 from the client terminal 5. The server function of the controller 100 transmits data such as a web page including a graphical user interface (GUI) to the client terminal 5. The client terminal 5 displays the web page or the like on a display based on the received data. The user looks at the web page or the like, checks information related to the semiconductor measurement or the like, and inputs settings and instructions as necessary. The client terminal 5 transmits information input by the user to the controller 100. The controller 100 executes processing related to the semiconductor measurement or the like based on the information input by the user, and stores the result. The controller 100 transmits data such as a web page including a processing result and the like to the client terminal 5. The client terminal 5 displays the web page including the processing result and the like on the display. The user checks the processing result and the like.

Processing Unit

FIG. 8 shows a configuration example of the processing unit 300 related to the BSE processing function 723 implemented based on the configuration of the controller 100 in FIG. 7. In FIG. 8, the processing unit 300, a control unit 400, and a GUI 500 are provided. The processing unit 300 and the control unit 400 are implemented by program processing by the processor 701 of the controller 100. The GUI 500 is implemented by being displayed as a screen on the display, for example, as the output apparatus 706 in FIG. 7 (or the client terminal 5 in FIG. 1) based on screen data that is generated in a form of a web page or the like based on processing by the processor 701 of the controller 100.

The processing unit 300 includes a dark pulse processing unit 304 and an image generation unit 307 as functional blocks. The dark pulse processing unit 304 includes, as functional blocks, a signal peak position detection unit 302, a dark pulse determination unit 303, a dark pulse removing unit 331, and a determination reference storage unit 309. Any functional block can be implemented by program processing by the processor 701, and a part of the functional blocks can be implemented by a dedicated circuit or the like.

The control unit 400 controls the processing unit 300. The control unit 400 receives input information such as instructions and settings from the user and control information 801 via the GUI 500. The control unit 400 transmits a control signal 811 generated based on the control information 801 to the processing unit 300. Each unit of the processing unit 300 is controlled according to the control signal 811. The processing unit 300 appropriately transmits a state signal 812 such as a processing result or a processing state to the control unit 400. The control unit 400 grasps processing based on the state signal 812 and generates state information 802 to be output to the GUI 500. The control unit 400 displays information such as a processing result or a processing state on the screen of the GUI 500 based on the state information 802.

The configuration example of the processing unit 300 in FIG. 8 is a configuration example in the case of implementing online processing. The controller 100 performs, as the online processing, processing such as dark pulse discrimination in almost real time based on the BSE detection signal.

The signal peak position detection unit 302 receives the signals 111*a* to 111*d* from the four channels in the detection signals 111 from the BSE detection circuits 211, and performs processing of detecting a peak time as a peak position of each signal. A peak position signal 306 output from the signal peak position detection unit 302 includes information for the four channels, is input to the dark pulse determination unit 303, and is also transmitted to the control unit 400 as the state information.

The dark pulse determination unit 303 determines, for the pixel at the target position, whether the signal is the dark pulse or the BSE signal based on the peak position signal 306 and determination reference information 341. A determination result information signal 342 output from the dark pulse determination unit 303 is input to the dark pulse removing unit 331.

Figure 11:
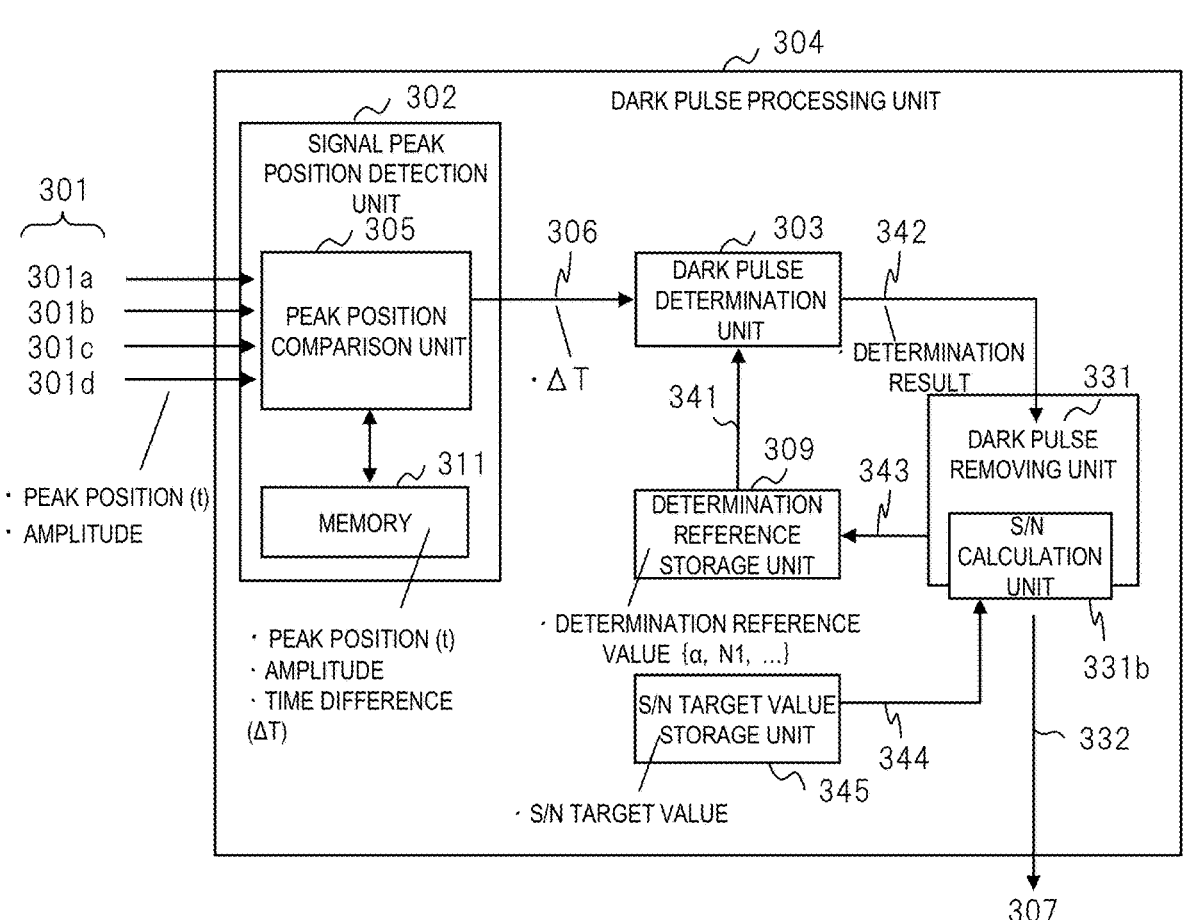
FIG. 11 shows a configuration example of a dark pulse processing unit in the first embodiment.

The dark pulse removing unit 331 removes a dark pulse portion from the detection signals of four channels according to the determination result information signal 342. A signal 332 from which the dark pulse is removed is input to the image generation unit 307. The dark pulse removing unit 331 performs S/N calculation to be described later (FIG. 11). The determination reference information 341 from the determination reference storage unit 309 is updated based on S/N information of the calculation result. The determination reference information 341 is stored and set in the determination reference storage unit 309.

The image generation unit 307 generates, based on the signal 332 from which the dark pulse is removed and the signal 310 which is the SE detection signal, an image for measuring the dimension of the pattern of the sample 3. The image generated by the processing of the image generation unit 307 is stored as image data 713 in the memory 702 in FIG. 7, for example. The generated image can be displayed on the screen of the GUI 500 in FIG. 8.

SE and BSE

Here, general behavior, characteristics, and the like of the secondary electrons 103 (SE) and the back scattered electrons 105 (BSE) in a case where there is, for example, a deep groove structure on the surface of the sample 3 to be measured and observed by the SEM 1 will be described with reference to FIG. 9 and the like.

FIGS. 9A to 9C show a case where there is a deep groove structure exposed on the X-Y plane, which is the surface of the sample 3 in the SEM. FIG. 9A is a schematic diagram showing an X-Y plane when a deep groove structure 901 on the surface of the sample 3 is enlarged and observed from above. FIG. 9B is a schematic diagram showing an X-Z plane corresponding to a line A-A in FIG. 9A as one cross section including a height and depth direction of the deep groove structure 901. FIG. 9C is a schematic diagram showing a Y-Z plane corresponding to a line B-B in FIG. 9A.

In FIG. 9A, in the present example, the deep groove structure 901 has a substantially rectangular opening in the X-Y plane, with a width 901*a* in the X direction and a width 901*b* in the Y direction. The width 901*a* in the X direction is also referred to as a short side, and the width 901*b* in the Y direction is also referred to as a long side.

In FIG. 9B, the deep groove structure 901 has a depth 901*c* in a downward direction of the Z axis when a height is Z=0 with an upper surface 902 of the sample 3 as a reference. The deep groove structure 901 has a substantially trapezoidal cross section as shown in the drawing, according to a general fabrication process example. An area of a bottom at the depth 901*c*, such as a width 901*d* of the short side, is smaller than an area of the opening at the height Z=0, such as the width 901*a* of the short side.

In FIG. 9C, the deep groove structure 901 has the same structure on the long side. In the deep groove structure 901, a width 901*e* of the long side of a bottom 903 at the depth 901*c* is smaller than the width 901*b* of the long side of the opening at the height Z=0.

The deep groove structure 901 has, for example, the depth 901*c* sufficiently larger than the width 901*a* of the short side, and such a structure is described as a deep groove or a deep hole. Depending on the pattern, the invention is not limited to such an example of the deep groove structure 901, and a groove or a hole may be formed longer in the X direction or the Y direction. The shape of the opening is not limited to a rectangle, and may be an ellipse. The structures can be collectively regarded as a groove structure or a hole structure.

FIGS. 10A to 10C are schematic explanatory diagrams showing an example of incidence and emission trajectories of the SEs and the BSEs corresponding to the deep groove structure 901 in FIG. 9. FIG. 10A shows an example of a trajectory of back scattered electrons among signal electrons generated when primary electrons, for example, primary electrons 401 and 402 are incident on the deep groove structure 901 in a cross section including the short side of the deep groove structure 901 as in FIG. 9B. FIG. 10B shows an example of a trajectory of secondary electrons among signal electrons generated when primary electrons, for example, primary electrons 401 and 402 are incident on the deep groove structure 901 in a cross section including the short side of the deep groove structure 901 as in FIG. 9B.

In FIGS. 10A and 10B, when the primary electrons 401 are incident on the upper surface 902 in the vicinity of the deep groove structure 901 of the sample 3, back scattered electrons B1 are generated in FIG. 10A, and secondary electrons S1 are generated in FIG. 10B. On the upper surface 902, the number of generated secondary electrons S1 is generally larger than the number of generated back scattered electrons B1.

When the primary electrons 402 are incident on the bottom 903 of the deep groove structure 901, the back scattered electrons B2 are generated in FIG. 10A, and the secondary electrons S2 are generated in FIG. 10B. In FIG. 10A, the primary electrons 402 are incident on the bottom 903 and collide with the bottom 903 to generate the back scattered electrons B2, and the back scattered electrons B2 pass through a side wall 904 in the X direction and are emitted upward from the upper surface 902 in the Z direction. In FIG. 10B, the primary electrons 402 are incident on the bottom 903 and collide with the bottom 903 to generate the secondary electrons S2, but the secondary electron S2 cannot pass through the side wall 904 in the X direction and are not emitted upward from the upper surface 902 in the Z direction.

In the case where the primary electrons 402 are incident on the bottom 903 of the deep groove structure 901, the back scattered electrons B2 have an energy higher than that of the secondary electrons S2, so that the back scattered electrons B2 can pass through the side wall 904 and are emitted from the upper surface 902 in many cases, as shown in FIG. 10A. The back scattered electrons B2 can be captured by the BSE detector 110. Meanwhile, the secondary electrons S2 have an energy lower than that of the back scattered electrons B2, so that the secondary electrons S2 cannot pass through the side wall 904 and are not emitted from the upper surface 902 in many cases, as shown in FIG. 10B. The secondary electrons S2 cannot be supplemented by the SE detector 115.

That is, in the deep groove structure 901, it is easy to obtain image information formed with the back scattered electrons, but it is difficult to obtain image information formed with the secondary electrons.

FIG. 10C shows an example of a trajectory in a case where primary electrons 403 are incident on and collide with the bottom 903 to generate back scattered electrons B3, and the back scattered electrons B3 pass through the side wall 904 in the Y direction and are emitted upward from the upper surface 902 in a cross section including the long side of the deep groove structure 901 as in FIG. 9C.

In the case where the primary electrons 403 are incident on the bottom 903 of the deep groove structure 901, a distance when the back scattered electrons B3 pass through the side wall 904 of the sample 3 is smaller in the Y direction corresponding to the long side than in the X direction corresponding to the short side. For example, a distance 906 is smaller than a distance 905. In other words, in the Y direction, the width 901*e* of the bottom 903 is larger than the width 901*d* thereof, and the width 901*e* is larger than the depth 901*c*. Therefore, the back scattered electrons B3 easily escape from the bottom 903 upward in the Z direction. Therefore, the number of back scattered electrons that can be captured by the BSE detectors 110 is larger for the back scattered electrons B3 in FIG. 10C than for the back scattered electrons B2 in FIG. 10A.

That is, when obtaining image information by the back scattered electrons for a three-dimensional structure such as the deep groove structure 901, a shape and dimension of the structure, a positional relationship with the BSE detectors, and the like affect detection.

In the above description, the influence due to the arrangement position and direction of the plurality of BSE detectors 110A to 110D of the BSE detector 110 is neglected. Specifically, as will be described later, the easiness of detecting the back scattered electrons also varies depending on the arrangement position and direction of the BSE detector.

The detection signal 121 output from the SE detector 115 in FIG. 2 is signal-processed by the SE detection circuit 116 and output as the signal 310 suitable for imaging. The signal 310 is imaged by the image generation unit 307 in FIG. 8.

Meanwhile, the BSE detection signals 111 (111a to 111d) output from the BSE detectors 110 (110A to 110D) in FIG. 2 are signal-processed by the BSE detection circuits 211 (211A to 211D) in FIG. 6, respectively. As an example, the detection signal 111a is converted into a voltage by the I/V conversion circuit 201 and converted into a digital signal by the ADC 202. After a falling time of the pulse waveform of the digital signal is shortened by the waveform shaping circuit 203, the peak position of the pulse waveform, in other words, the peak time and the amplitude are detected by the peak detection circuit 204. The detection signals 111 of other channels are similarly processed. The peak position and the amplitude of the BSE detection signals 111 (111a to 111d) of the four channels are input to the dark pulse processing unit 304 in FIG. 8 as the signals 301 (301a to 301d).

Dark Pulse Processing Unit

The processing of the dark pulse processing unit 304 will be described with reference to FIG. 11 and the like. FIG. 11 shows a more detailed configuration of the dark pulse processing unit 304 in FIG. 8. The signal peak position detection unit 302 provided in the dark pulse processing unit 304 includes a peak position comparison unit 305 and a memory 311.

The peak position comparison unit 305 inputs the signals 301 (301a to 301d) transmitted from the BSE detection circuits 211 of the four channels. The signals 301 include information such as the peak position, in other words, a peak time (t), information such as an amplitude, or the like. The peak position comparison unit 305 calculates a time difference (ΔT) in peak position in order to compare the pulse signals included in each pixel of the signals 301 between channels. The peak position comparison unit 305 stores information including a peak position and an amplitude of the compared pulse signal and the time difference ΔT in peak position in the memory 311 and outputs the information as the signal 306.

The dark pulse determination unit 303 compares the time difference ΔT of the signal 306 with the determination reference value of the determination reference information 341 between the pulse signals. The dark pulse determination unit 303 determines that the compared pulse signal is the BSE signal when the time difference ΔT of the signal 306 is equal to or less than the determination reference value, and determines that the compared pulse signal is the dark pulse when the time difference ΔT of the signal 306 exceeds the determination reference value. The dark pulse determination unit 303 outputs the pulse signal and the signal 342 indicating a determination result, that is, a result of discrimination between the BSE signal and the dark pulse. The dark pulse determination unit 303 may store information including the determination result in the memory or may transmit the information as the state information to the control unit 400.

The dark pulse removing unit 331 receives the pulse signal and the determination result signal 342, and removes a portion of the pulse signal determined as the dark pulse indicated by the signal 342. The dark pulse removing unit 331 outputs the signal 332 as a result of removal and transmits the signal 332 to the image generation unit 307.

Here, the dark pulse removing unit 331 may perform S/N calculation for checking and evaluating the S/N of the signal from which the dark pulse is removed. In the first embodiment, the S/N calculation is also performed by an S/N calculation unit 331b in the dark pulse removing unit 331. As a result of the S/N calculation, information indicating the S/N of the signal from which the dark pulse is removed is obtained. The dark pulse removing unit 331 compares the S/N value with a target value 344 set and stored in an S/N target value storage unit 345. When the S/N is less than the target value 344 as a result of the comparison, the dark pulse removing unit 331 adjusts the determination reference value in the determination reference storage unit 309. The dark pulse removing unit 331 stores adjusted determination reference information 343 in the determination reference storage unit 309. In this case, the dark pulse determination unit 303 performs the dark pulse determination again in the same manner using the adjusted determination reference information 343 as the determination reference information 341.

When the S/N obtained by the dark pulse removing unit 331 is equal to or larger than the target value 344, the dark pulse determination unit 303 transmits the signal 332 from which the dark pulse is removed to the image generation unit 307. The image generation unit 307 generates an image based on the signal 332 from which the dark pulse is removed.

As a method for removing the dark pulse by the dark pulse removing unit 331, for example, the following can be applied. The dark pulse removing unit 331 sets the pulse signal portion determined as the dark pulse to a zero value for the signals 301 from four channels. Accordingly, the dark pulse can be removed.

The configuration of the dark pulse processing unit 304 described above is a configuration that can cope with the online processing, that is, the signal processing substantially in real time. In the first embodiment, the dark pulse determination and the dark pulse removal in the offline processing can be handled. The offline processing is to perform processing such as dark pulse determination at any time after the signals 111 are generated. Therefore, the dark pulse processing unit 304 also transmits data and information corresponding to the signals 301 (301a to 301d) including the peak position and the amplitude, the signal 306 including the time difference ΔT output from the signal peak position detection unit 302, and the like to the control unit 400. The control unit 400 stores the data and information in a storage resource such as the memory 702. When performing offline processing, the control unit 400 refers to the data and information stored in the storage resource and performs processing such as dark pulse determination similar to that described above by the program processing.

Dark Pulse Determination

Figure 12:
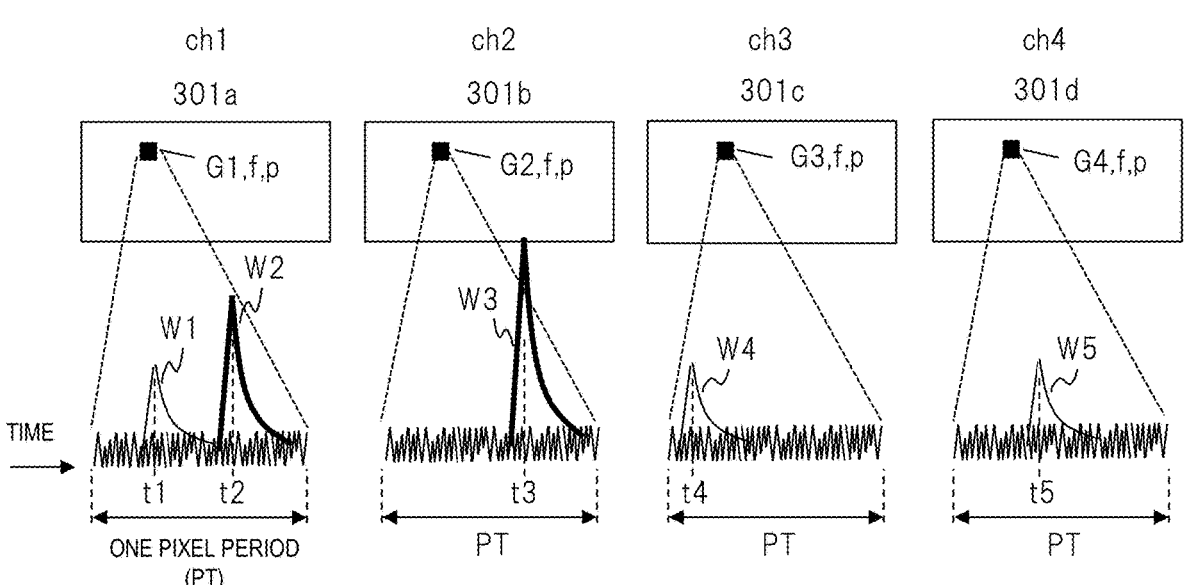
FIG. 12 shows an example of BSE detection signals from a plurality of channels in the first embodiment.
Figure 13:
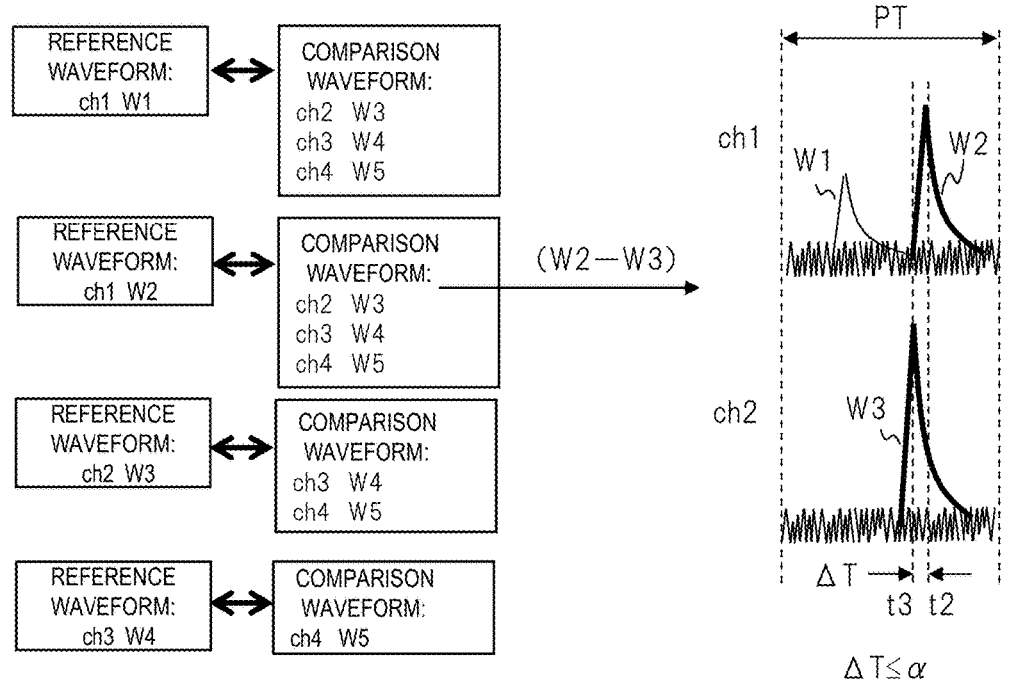
FIG. 13 shows an example of comparison of pulse signal combinations between the channels in the first embodiment.

FIGS. 12 and 13 are schematic explanatory diagrams showing a specific example of the processing by the dark pulse processing unit 304 in FIG. 11. FIG. 12 shows an example of waveforms of the signals 301 (301a to 301d) which are detection signals from the four channels (ch1, ch2, ch3, and ch4) for the same pixel at a certain one target position and which are obtained by scanning the surface of the sample 3. The horizontal axis is a time axis. The waveform includes a BSE signal waveform and a dark pulse waveform. For the same frame, the same pixels in each channel are represented as G1,f,p, G2,f,p, G3,f,p, and G4,f, p. For the pixels, one pixel period PT is provided as the same period.

In the present example, the signal 301a received by the first channel ch1 includes a waveform W1 and a waveform W2 as the pulse signal. The signal 301b received by the second channel ch2 includes a waveform W3 as the pulse signal. The signal 301c received by the third channel ch3 includes a waveform W4 as the pulse signal. The signal 301d received by the fourth channel ch4 includes a waveform W5 as the pulse signal. Each waveform has a peak time which is a peak position. For example, the peak time that is the peak position of the waveform W1 is t1.

In the first embodiment, the data of the signals 301 transmitted to the signal peak position detection unit 302 includes the peak position and the amplitude of each waveform as described above, but in FIG. 12, the data is shown as a pulse waveform for ease of understanding.

As for the back scattered electrons, as described above, the BSE detection signals may be detected by all the BSE detectors 110 of the four channels almost simultaneously or may be detected by the BSE detectors 110 of a smaller number of channels, depending on the voltage Vx and the current Ix of the electron gun 101 and the state of the sample 3, but the BSE detection signals are input to and received by the BSE detectors 110 of a plurality of channels almost simultaneously. On the other hand, the dark pulse is generated randomly. Therefore, the dark pulse has a small probability of occurring simultaneously in the BSE detectors of the plurality of channels. In the first embodiment, such a mechanism is used.

The dark pulse determination unit 303 of the dark pulse processing unit 304 determines whether the time difference $\Delta T$ in peak position between the pulse signals in the BSE detectors 110 of any first number (for example, N1=2) channels among all the four channels is equal to or less than or exceeds the determination reference value ($\alpha$). When the fact that a peak time difference, which is the time difference $\Delta T$ in peak position, is equal to or less than the determination reference value $\alpha$ occurs in the first number N1 or more channels almost simultaneously, for example, occurs within one pixel period PT, the dark pulse determination unit 303 determines that the pulse signal corresponding thereto is the BSE signal.

On the other hand, when the fact that the peak time difference is equal to or less than the determination reference value $\alpha$ occurs in the less than first number (for example, N1=2) channels almost simultaneously, the dark pulse determination unit 303 determines that the pulse signal corresponding thereto is the dark pulse. The dark pulse determination unit 303 compares the pulse signals from the four channels between the channels, and determines, when the peak time difference is larger than the determination reference value $\alpha$, that the pulse signal corresponding thereto is the dark pulse.

FIG. 13 shows an example of a method for comparing a peak time difference between the pulse signal waveforms. The dark pulse determination unit 303 examines combinations of two waveforms comprehensively and without duplication for the waveforms W1 to W5 included in the signals 301 (301a to 301d) from the four channels as the peak position within the one pixel period PT. FIG. 13 shows an example of comparison of such combinations. The dark pulse determination unit 303 basically determines the peak time difference between the waveforms in different channels, and further determines the peak time difference between the waveforms even in the same channel when there are a plurality of waveforms in the same channel.

In the present example, firstly, the waveform W1 in the first channel ch1 is used as a reference waveform, and the waveform W3 in the second channel ch2, the waveform W4 in the third channel ch3, and the waveform W5 in the fourth channel ch4 are used as comparison waveforms. (W1-W3), (W1-W4), and (W1-W5) are sets for comparison between the reference waveform and the comparison waveforms. Secondly, the waveform W2 in the first channel ch1 is used as a reference waveform, and the waveform W3, the waveform W4, and the waveform W5 are used as comparison waveforms. Thirdly, the waveform W3 in the second channel ch2 is used as a reference waveform, and the waveform W4 and the waveform W5 are used as comparison waveforms. Fourthly, the waveform W4 in the third channel ch3 is used as a reference waveform, and the waveform W5 is used as a comparison waveform.

The dark pulse determination unit 303 compares the peak time differences with the determination reference value $\alpha$ for the sets. In the present example, as shown on a right side, the time difference $\Delta T$ between a peak time t2 and a peak time t3 as the peak time difference in the set of the waveform W2 and the waveform W3 among all the combinations is equal to or less than the determination reference value $\alpha$ ($\Delta T \leq \alpha$). In other sets, the time difference $\Delta T$ exceeds the determination reference value $\alpha$. The number of channels corresponding to $\Delta T$ being equal to or less than a is 2.

Therefore, the dark pulse determination unit 303 determines that signals in the set of the waveform W2 and the waveform W3 are the BSE signal. The dark pulse determination unit 303 determines that signals for all other waveforms (W1, W4, and W5) that do not correspond to the set of the waveform W2 and the waveform W3 are the dark pulse since the time difference $\Delta T$ in each combination exceeds the determination reference value $\alpha$. The same processing is performed on other frames and other pixels in time series.

As described above, the peak time difference of the pulse signals between the channels is examined by the dark pulse determination unit 303, and the BSE signal and the dark pulse can be discriminated depending on whether the condition using the determination reference value $\alpha$ or the number of channels (for example, N1=2) is satisfied. The number of channels for which the time difference $\Delta T$ is equal to or less than the determination reference value $\alpha$ (for example, N1=2) may be stored in the determination reference storage unit 309 as a setting value as parameters constituting the condition.

As described above, the first embodiment utilizes the fact that, in the BSE detectors 110 (110A to 110D) of the four channels, there is a correlation between the channels in the position and time at which the BSE signal is generated, and there is no correlation between the channels in the position and time at which the dark pulse is generated. According to the first embodiment, the BSE signal and the dark pulse can be discriminated by comparing the peak positions of the detection pulses based on such a mechanism.

Processing Flow

Figure 14:
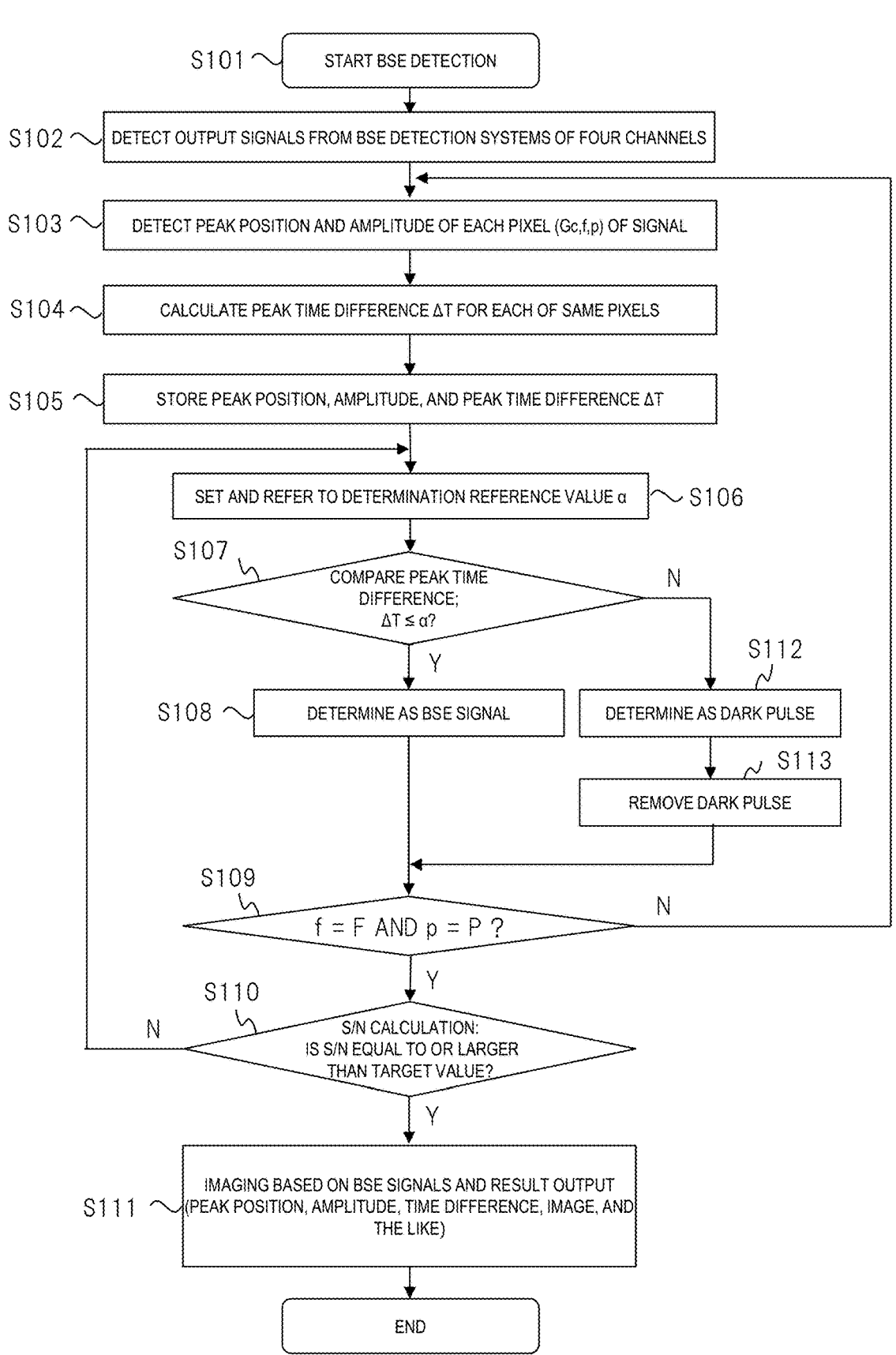
FIG. 14 shows a processing flow of the controller in the first embodiment.

FIG. 14 shows a processing flow mainly performed by the controller 100 in the charged particle beam apparatus 1 according to the first embodiment. The present flow includes steps S101 to S113. The present flow corresponds to the description of the processing unit 300 in FIG. 8 as a processing flow, and the processing content corresponds thereto. A part of the processing content is performed by the BSE detection circuit 211 in FIG. 6.

In step S101, the controller 100 (more specifically, the processor 701. The same applies hereinafter) starts BSE detection. The start corresponds to the start of measurement of the sample 3. In step S102, the charged particle beam apparatus 1 detects the output signals from the BSE detection systems of the four channels. That is, the charged particle beam apparatus 1 obtains the signals 111 (111a to 111d) output from the four BSE detectors 110 (110A to 110D).

In step S103, the charged particle beam apparatus 1 detects, based on the signals 111 (111a to 111d), the peak time or amplitude value, which is a peak position, for the pixel (Gc,f,p) at the target positions in the frames of the channels by the BSE detection circuit 211. The controller 100 inputs and acquires the signals 301 (301a to 301d) whose peak position or the like is detected.

In step S104, the controller 100 calculates, based on the signals 301 (301a to 301d), the peak time difference (ΔT) between the pulse signals for each target pixel.

In step S105, the controller 100 stores, based on the signals 301, information including the peak position, the amplitude, the peak time difference, and the like for each target pixel in the memory.

In step S106, the controller 100 sets the determination reference value (α) related to the peak time difference (ΔT), or refers to the set determination reference value (α).

In step S107, the controller 100 compares the peak time differences between the channels for each target pixel, and determines whether the time difference ΔT is equal to or less than the determination reference value α. When the time difference ΔT is equal to or less than the determination reference value α (Y), the process proceeds to step S108, and when the time difference ΔT exceeds the determination reference value α (N), the process proceeds to step S112. More specifically, as described above, whether the number of channels corresponding to the set of pulse signals whose time difference ΔT is equal to or less than the determination reference value α is equal to or larger than the first number (for example, N1=2) is also determined as a condition.

In step S108, the controller 100 determines that the pulse signals in the pulse signal set that satisfies the condition in step S107 are the BSE signal.

In step S112, the controller 100 determines that the pulse signals in the pulse signal set that does not satisfy the condition in step S107 are the dark pulse. In other words, the controller 100 determines that the pulse signals other than the pulse signal determined to be the BSE signal in step S108 are the dark pulse.

Further, the process proceeds from step S112 to step S113. In step S113, the controller 100 removes a portion determined to be the dark pulse from the detection signal.

In step S109, the controller 100 checks whether the above processing is completed for all target frames and pixels, and when the above processing is not completed (N), the process returns to step S103 and is repeated in the same manner. When the process is completed, the process proceeds to step S110.

In step S110, the controller 100 performs the S/N calculation described above in order to check the effect after the dark pulse removal. The controller 100 checks whether the S/N value obtained by the calculation is equal to or larger than the S/N target value. When the S/N value does not reach the target value (N), the process returns to step S106. In this case, in step S106, the controller 100 resets the determination reference value α. When the S/N value reaches the target value (Y), the process proceeds to step S111.

In step S111, the controller 100 performs imaging by the image generation unit 307 based on the processed BSE signal (the signal 332 in FIG. 8), and obtains an image generated as a result. In step S111, the controller 100 outputs related data and information such as a peak position, an amplitude, a peak time difference, a determination reference value, and an image handled in the above processing. The output includes a storage in the memory and an output to the user in FIG. 1 as an external output. For example, an image formed based on the BSE detection is displayed on the display screen along with the GUI.

In the above embodiment, the case has been described where the four channels, in other words, the four detection systems are provided as the BSE detector 110. However, the invention is not limited thereto, and a case can be similarly applied where the number of channels is less than or greater than 4.

FIG. 15 relates to the BSE processing function, and shows an example of the data and information stored in the memory by the controller 100 as, for example, a database table. The upper table in FIG. 15 includes, as items, an ID of the sample 3, a pixel Gc,f,p, an ID of the pulse signal waveform, the peak position (in other words, the peak time t), the amplitude, a file name of the image, and the like. The lower table includes, as items, an ID of a combination of the pulse signal waveforms, the peak time difference (ΔT), the determination reference value (for example, a), and a value of the dark pulse or the BSE signal as a determination result.

The controller 100 may display the information in the table in FIG. 15 on the screen via the GUI. The lower table may be a table temporarily generated during processing.

Effects According to First Embodiment

As described above, according to the charged particle beam apparatus 1 in the first embodiment, detection deterioration of the BSE detectors 110 caused by the dark pulse generated therein can be reduced, in other words, improvement of measurement accuracy and the like can be achieved. According to the first embodiment, the dark pulse and the BSE signal in the output signals of the BSE detectors 110 can be discriminated and detected, and the dark pulse can be removed based on the detection result. Accordingly, according to the first embodiment, the S/N of an acquired image based on the BSE detectors 110 can be improved, detailed information on the three-dimensional structure such as a hole or a groove can be obtained, high length measurement accuracy can be achieved, and a machine difference can also be reduced.

In the case of the online processing described above, only the data and information necessary for the online processing is acquired and temporarily stored in the storage resource, and the processing is performed substantially in real time. The processed temporary storage data is appropriately deleted. In this case, the number of storage resources required for the system is relatively small. In the case of the offline processing described above, once all the data and information necessary for the offline processing are acquired and stored in the storage resource, the stored data and information can be referred to and processed collectively when necessary. In this case, the calculation may take some time.

Second Embodiment

Charged particle beam apparatus according to a second embodiment will be described with reference to FIG. 16 and subsequent drawings. A basic configuration in the second embodiment is the same as that in the first embodiment. In the following, components in the second embodiment that are different from those in the first embodiment will be mainly described. The second embodiment differs from the first embodiment mainly in the following points.

The dark pulse determination unit 303 in FIG. 8 in the first embodiment determines whether signals for target pixels in one frame are a dark pulse or a BSE signal for each one pixel period PT as a time T. In the first embodiment, different determinations are made for each frame period. On the other hand, in the second embodiment, a dark pulse determination unit determines, for a target pixel, whether signals within the period corresponding to a plurality of frames each including the target pixel are a dark pulse or a BSE signal. In the second embodiment, similar to the first embodiment, peak time differences are compared for combinations of pulse signal waveforms between channels with respect to almost simultaneous generation of pulse signals. In the second embodiment, a time range to be compared, in other words, a determination target period is extended as the period corresponding to the plurality of frames. In the second embodiment, for each pixel at a target position, within the period corresponding to the plurality of frames, peak time differences are compared for the combinations of the pulse signal waveforms between channels, and discrimination between the BSE signal and the dark pulse is performed.

Dark Pulse Processing Unit

Figure 16:
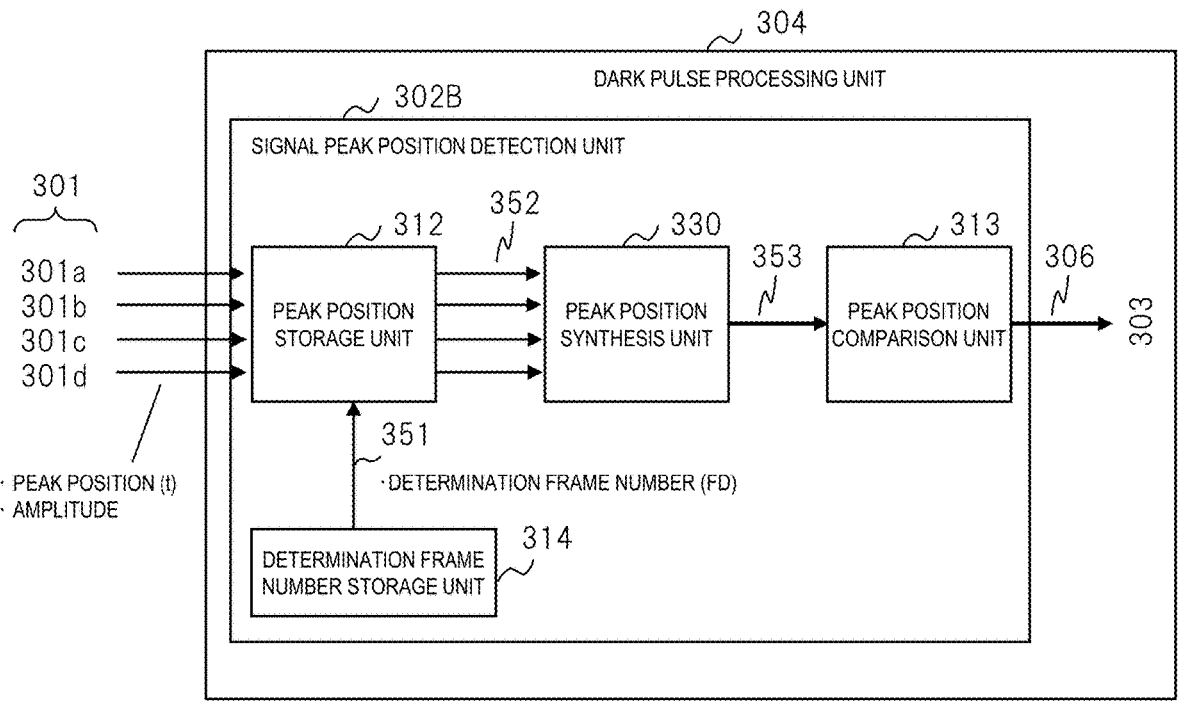
FIG. 16 shows a configuration example of a dark pulse processing unit in a second embodiment.

FIG. 16 shows a functional block configuration example of a signal peak position detection unit 302B that is in a preceding stage of the dark pulse determination unit 303 in the dark pulse processing unit 304 according to the second embodiment. The signal peak position detection unit 302B includes, in order from an input side, a peak position storage unit 312, a peak position synthesis unit 330, a peak position comparison unit 313, and a determination frame number storage unit 314. The peak position storage unit 312 includes a memory.

The dark pulse processing unit 304 sets a determination frame number 351 as one of determination reference values in the determination frame number storage unit 314. The determination frame number 351 is FD. The determination frame number storage unit 314 stores information including the determination frame number FD. The determination frame number FD is smaller than the maximum frame number F, and can be set by design or user settings. The control unit 400 may designate the determination frame number FD in advance based on the user settings or the like and set the determination frame number FD in the determination frame number storage unit 314.

The peak position storage unit 312 refers to the determination frame number 351 (FD) set in the determination frame number storage unit 314 for the input signals 301. The peak position storage unit 312 stores, for a target pixel included in the signals 301 from a plurality of channels, peak positions of pulse signal waveforms included in a plurality of frame ranges corresponding to the determination frame number FD within one pixel period corresponding to the target pixel. That is, for each target pixel (Gc,f,p), the number of pixels for which the peak position is stored is the number multiplied by FD when a waveform appears in each frame. For all pixels and all channels, the number of pixels is the number multiplied by C×P×FD.

Signals 352 including the peak position and temporarily stored in the peak position storage unit 312 are input to the peak position synthesis unit 330. The peak position synthesis unit 330 performs synthesis processing on the peak positions of the waveforms within the determination target period based on the determination frame number FD. The synthesis processing is processing for comparison in the peak position comparison unit 313 in the subsequent stage.

Figure 17:
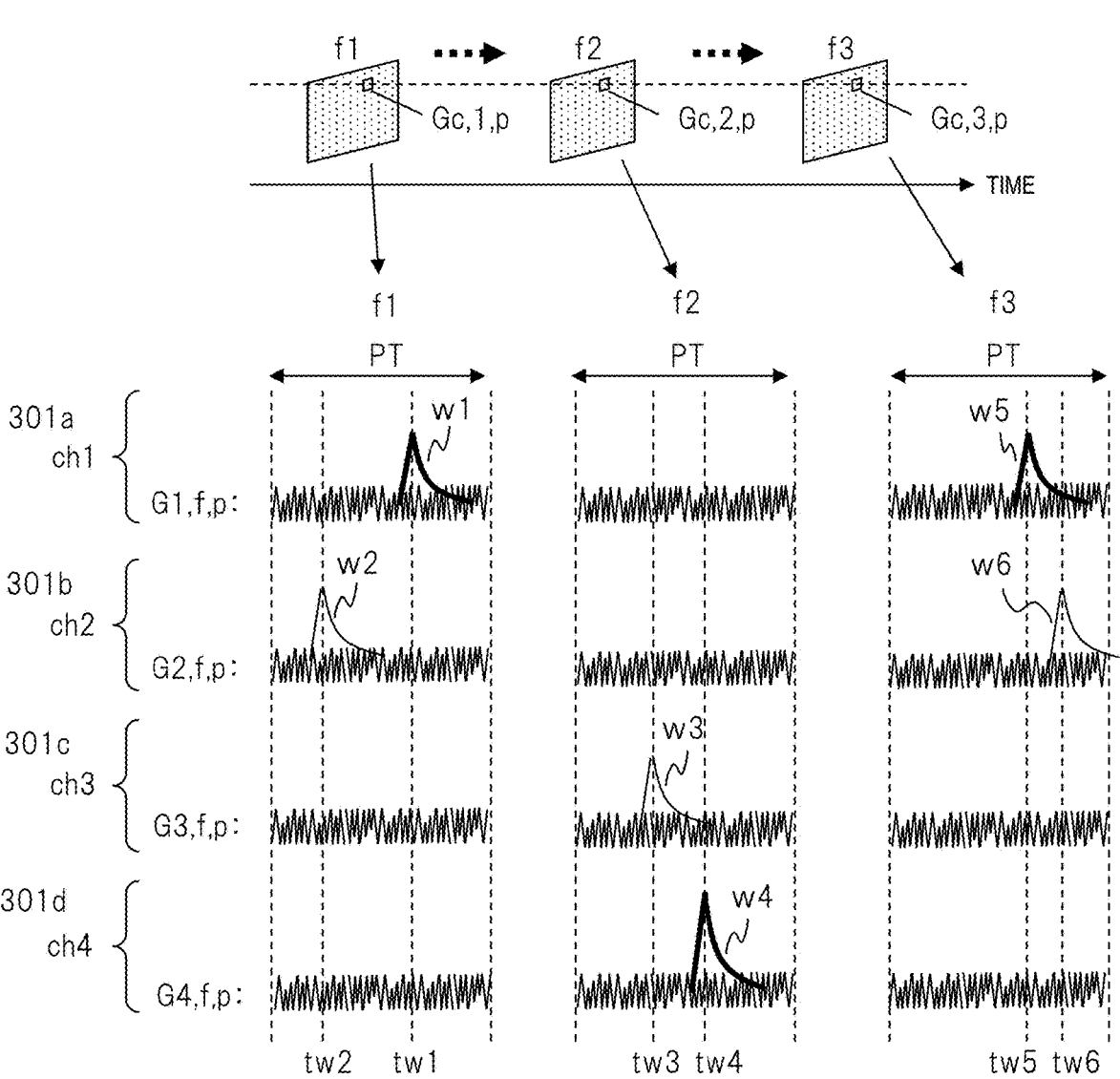
FIG. 17 shows an example of signals within a period of a plurality of frames in BSE detection signals from a plurality of channels in the second embodiment.

FIG. 17 is an explanatory diagram showing the synthesis processing by the peak position synthesis unit 330. FIG. 17 shows an example of pulse signal waveforms in three frames which are frames f1, f2, and f3 as an example of a plurality of frames, for the signals 301 (301a to 301d) from the four channels obtained by scanning the surface of the sample 3 within the one pixel period PT corresponding to a p-th pixel in each frame as a pixel of a certain target position. In the present example, the determination frame number FD is 3. For example, in the first channel ch1, target pixels G1,f,p in the three frames f1, f2, and f3 can be expressed as a pixel G1,1,p, a pixel G1,2,p, and a pixel G1,3,p. The same applies to other channels.

The BSE signal and the dark pulse are inherent in the signals 301. In the present example, the frame f1 includes a waveform w1 in the first channel ch1 and a waveform w2 in the second channel ch2, the frame f2 includes a waveform w3 in the third channel ch3 and a waveform w4 in the fourth channel ch4, and the frame f3 includes a waveform w5 in the first channel ch1 and a waveform w6 in the second channel ch2. Each waveform includes the peak time t which is a peak position. For example, the peak position of the waveform w1 is a peak time tw1.

For the pixel at the target position, for example, when the frame f2 is used as a reference, a plurality of (FD=3) frames taken as the determination target period by referring to previous and subsequent frames of the frame f1 one before the frame f2 and the frame f3 one after the frame f2. The invention is not limited thereto. For example, when the frame f1 is used as a reference, a plurality of (FD) frames may be taken by referring to temporally subsequent frames of the frame f2 after one frame from the frame f1 and the frame f3 after two frames from the frame f1. For example, when the frame f3 is used as a reference, a plurality of (FD) frames may be taken by referring to temporally previous frames of the frame f2 before one frame from the frame f3 and the frame f1 before two frames from the frame f3.

The peak position synthesis unit 330 synthesizes, for each channel, waveforms in a plurality of frames (f1, f2, f3) (FD=3) as a waveform group for each pixel period PT. The peak position synthesis unit 330 outputs signals 353 as a synthesis result.

Figure 18:
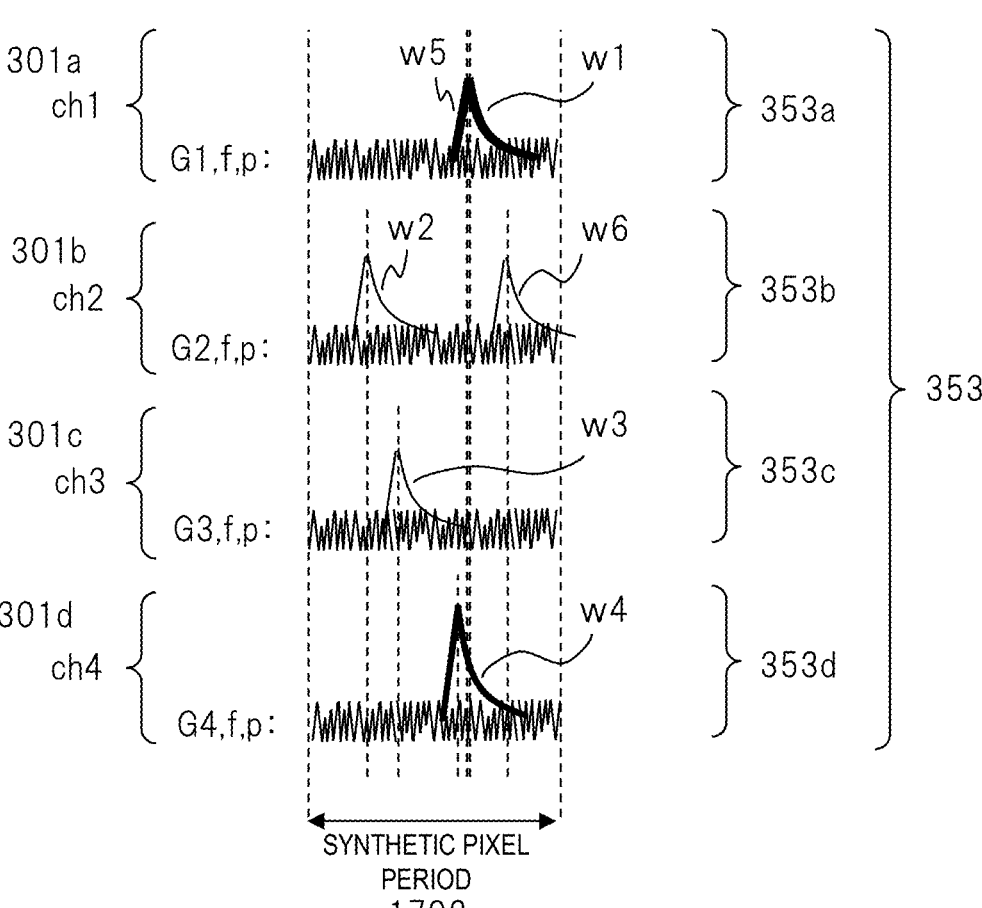
FIG. 18 shows an example in which the signals within the plurality of frame periods are combined into one in the second embodiment.

FIG. 18 shows an example of a result of synthesizing the waveforms for each channel based on the signals 301 in FIG. 17. A synthetic frame 1701 is described after the synthesis of a plurality of frames, and a synthetic pixel period 1702 is correspondingly described after the synthesis of a plurality of pixel periods. Synthesized signals in FIG. 18 are shown as signals 353a, 353b, 353c, and 353d for each channel. The signal 353a in the first channel ch1 within the synthetic pixel period 1702 includes the waveform w1 and the waveform w5. The waveform w1 and the waveform w5 overlap at substantially the same time. The signal 353b in the second channel ch2 within the synthetic pixel period 1702 includes the waveform w2 and the waveform w6. The signal 353c in the first channel ch3 within the synthetic pixel period 1702 includes the waveform w3. The signal 353d in the first channel ch4 within the synthetic pixel period 1702 includes the waveform w4.

Here, when the number of the back scattered electrons 105 detected by the BSE detectors 110 is small, the back scattered electrons 105 may not be received as the pulse signal corresponding to the BSE signals from the BSE detectors 110 (110A to 110D) of a plurality of channels. In this case, in the method described in the first embodiment, since the number of pulse signals corresponding to the BSE signals appearing in the plurality of channels is small, it may be difficult to determine the discrimination between the BSE signal and the dark pulse.

Therefore, in the second embodiment, the determination target period is extended to the synthetic pixel period 1702 of the synthetic frame 1701 including the plurality of (FD) frames so as to facilitate the determination even when the number of detected back scattered electrons 105 is small. In this way, by synthesizing the signals from the plurality of frames for each channel, more pulse signals corresponding to the BSE signals can be expected to be received within the synthetic pixel period 1702 of the synthetic frame 1701. It can be expected that, in the synthetic pixel period 1702, there is a high probability that the pulse signals corresponding to the BSE signals are generated almost simultaneously in the plurality of channels. On the other hand, since the dark pulse is generated randomly, it can be expected that the probability that the dark pulse is generated almost simultaneously in each channel is low even within the synthetic pixel period 1702 of the synthetic frame 1701. Based on such a mechanism, in the second embodiment, determination for the discrimination between the BSE signal and the dark pulse is performed using conditions same as those in the first embodiment for the synthesized signal.

The peak position comparison unit 313 calculates, based on the synthesized signals 353 (353*a* to 353*d*), the peak time difference ($\Delta T$) for each combination between the channels with respect to the pulse signal waveform from each channel, and outputs a signal including information such as a peak position of a pulse signal and a peak time difference for each pixel in each channel as the signal 306.

Similarly to the first embodiment, the dark pulse determination unit 303 compares the peak time difference of the signal 306 with the determination reference value a, and determines that the compared pulse signal is the BSE signal when the number of channels corresponding to the time difference $\Delta T$ being equal to or less than the determination reference value $\alpha$ is equal to or larger than the first number (for example, N1=2). The dark pulse determination unit 303 determines that the pulse signal that does not satisfy the condition is the dark pulse. The subsequent processing of the dark pulse removing unit 331 and the like is the same as that in the first embodiment.

Figure 19:
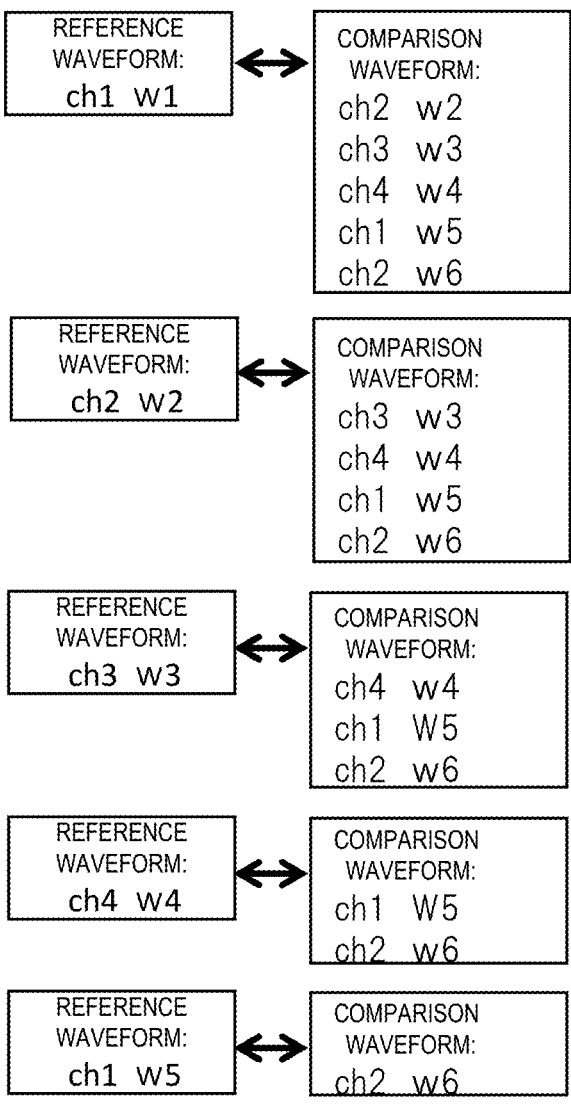
FIG. 19 shows an example of comparison of pulse signal combinations between the channels in the second embodiment.

FIG. 19 shows an example of examining peak time differences between combinations of waveforms based on the synthesized signal 353 in FIG. 18. Similarly to the first embodiment, the peak time difference is examined for all combinations of the waveforms comprehensively and without overlap. A plurality of waveforms (for example, the waveform w1 and the waveform w5) in different frames in the same channel are examined as a set.

In the present example, for the three waveforms which are the waveform w1 in the frame f1 in the first channel ch1, the waveform w5 in the frame f3 in the first channel ch1, and the waveform w4 in the frame f2 in the second channel ch4 in FIG. 18, the peak time differences are equal to or less than the determination reference value $\alpha$. Therefore, the dark pulse determination unit 303 determines the waveform w1, the waveform w4, and the waveform w5 to be the BSE signal, and determines the waveform w2, the waveform w3, and the waveform w6 to be the dark pulse.

Processing Flow

The processing flow of the controller 100 in the second embodiment is schematically the same as the flow in FIG. 13 in the first embodiment, but is different in configuration as follows. In step S102 described above, the controller 100 first starts processing in order from a first frame among the plurality of F frames. As shown in FIG. 16, the controller 100 performs processing while storing information for each frame in the memory. In step S103, the controller 100 acquires, for each target pixel, a signal in a frame including the target pixel within a pixel period, and detects the peak position or the like.

In step S104, the controller 100 sets the plurality of FD frames including, for example, previous and subsequent frames as a range for each target pixel, acquires the signals within the pixel period while referring to the information stored in the memory for each frame, and calculates the peak time differences between the pulse signals. In step S105, the controller 100 stores the calculated peak time differences and the like in the memory. The controller 100 similarly repeats the processing from steps S102 to S105 sequentially for each frame.

Thereafter, the controller 100 performs the synthesis processing as shown in FIG. 17 based on the information in the memory, and similarly performs the processing in step S106 and the subsequent steps on the synthesized signal. In other words, the synthesis processing is to combine the pixel periods of different frames as the synthetic pixel period 1702 of the same single synthetic frame 1701 to compare the peak times.

Effects According to Second Embodiment

The second embodiment utilizes the fact that, in the BSE detectors 110 of the plurality of (four) channels, there is a correlation between the same channels and between the channels in the position and time at which the BSE signals in the plurality of (FD) frames are generated, and there is no correlation between the channels in the position and time at which the dark pulse is generated. In the second embodiment, the BSE signal and the dark pulse can be discriminated by comparing the peak positions of the pulses in the detection signals from the plurality of channels based on such a mechanism. In the second embodiment, not only when there is a correlation between different channels, but also when there is a correlation between signals in different frames in the same channel as shown in the example in FIG. 18, the BSE signal and the dark pulse can be discriminated for the signals. Accordingly, even when the detection number of back scattered electrons is small, the detection accuracy of the BSE signal can be improved.

Third Embodiment

Charged particle beam apparatus according to a third embodiment will be described with reference to FIG. 20 and subsequent drawings. The third embodiment can also be regarded as a modification of the second embodiment. In the second embodiment and the first embodiment, a plurality of detection signals from the BSE detectors 110 of a plurality of channels are targeted for determination for discrimination. In the third embodiment, similarly to the second embodiment, a determination target period is extended to a period such as a plurality of FD frames. In the third embodiment, instead of a plurality of detection signals from the BSE detectors 110 of the plurality of channels, a single detection signal from the BSE detector 110 of a single channel is targeted for discrimination in the same manner as in the second embodiment. The controller 100 targets the single detection signal from the single BSE detector 110, and performs determination for the discrimination between the BSE signal and the dark pulse for a pixel at a target position with the plurality of FD frames as a range.

Single BSE Detector

Figure 20:
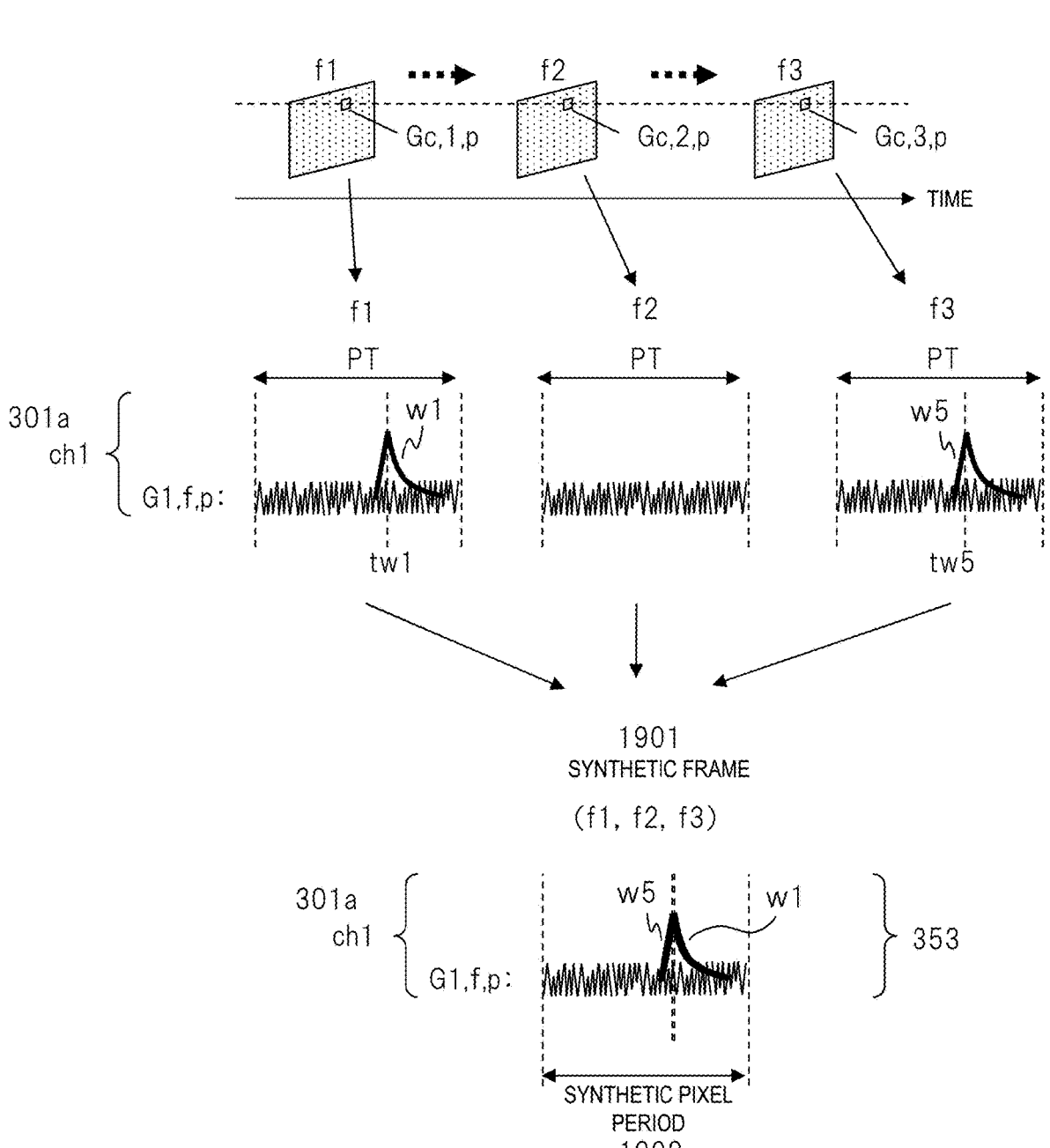
FIG. 20 shows an example in which signals within a period of a plurality of frames in BSE detection signals from a single channel are combined into one in a third embodiment.

FIG. 20 is a schematic explanatory diagram showing dark pulse determination in the third embodiment. In an example according to the third embodiment, a case will be described where, for example, only the detection signal 111*a* (the signal 301*a* in FIG. 6) from the BSE detector 110A as the first channel ch1 among the BSE detectors 110 in FIG. 2 is used as a determination target. The invention is not limited thereto, as a modification, even when the charged particle beam apparatus includes only a single BSE detector, the same determination can be made for the single BSE detector.

In the third embodiment, a configuration of the dark pulse processing unit 304 of the controller 100 is the same as that in FIGS. 11 and 16. A different configuration thereof is that the peak position storage unit 312 in FIG. 16 receives only a detection signal from the single BSE detector, for example, the signal 301*a*, and performs processing for each frame in time series. The peak position storage unit 312 sets a plurality of frames corresponding to the determination frame number FD as a determination target period for each pixel at a target position, calculates a peak position of the pulse signal in each frame, and stores the peak position in the memory. The peak position storage unit 312 outputs a signal such as a peak position of a pulse signal in each frame, which is based on the detection signal from the single BSE detector, as the signal 352 of a single series.

Similarly to the second embodiment as in the example in FIG. 20, the peak position synthesis unit 330 synthesizes, based on the signal 352, the signals in the plurality of FD frames within the pixel period into one for each target pixel to obtain a signal in a synthetic frame 1901 within a synthetic pixel period 1902. The example in FIG. 20 corresponds to a portion of the signal 301*a* from the first channel ch1, which is extracted from FIGS. 17 and 18. The peak position synthesis unit 330 outputs the synthesized signal 353.

The peak position comparison unit 313 compares, based on the synthesized signal 353, the peak time difference (ΔT) between pulse signal waveforms included within the synthetic pixel period 1902 for each target pixel with a threshold value as the determination reference value (α), and determines discrimination between the BSE signal and the dark pulse. The determination is as follows.

The controller 100 of the charged particle beam apparatus 1 according to the third embodiment targets a pulse signal received and appearing within the plurality of FD frame periods as the time T for each pixel at a target position, for an output signal of a single system from the single BSE detector. The controller 100 determines whether the peak time difference between the pulse signal waveforms is equal to or less than the threshold value when a plurality of at least two pulse signals are received and appear within the plurality of FD frame periods. The controller 100 estimates and determines, when the peak time difference between the pulse signal waveforms is equal to or less than the threshold value, that the pulse signals are caused by the BSE, in other words, the pulse signals are the BSE signal.

Conversely, the controller 100 estimates and determines, when only a single pulse signal is received and appears within the plurality of FD frame periods, or when the peak time difference between the waveforms exceeds the threshold value even when a plurality of pulse signals are received and appear, that the pulse signal is caused by the dark pulse, in other words, the pulse signal is the dark pulse.

Effects According to Third Embodiment

As described above, according to the third embodiment, even when the detection signal from the single BSE detector and the single BSE detection system is targeted in the SEM or the like, the discrimination between the BSE and the dark pulse can be performed.

In a modification of the third embodiment, when a plurality of BSE detectors and a plurality of BSE detection systems are provided in an SEM or the like as shown in FIG. 2, determination same as that in the third embodiment for the output signal of any one BSE detector selected therefrom can be performed. The determination same as that in the third embodiment can be independently performed for each output signal from each BSE detector.

In the modification of the third embodiment or the second embodiment, the determination target period is not limited to the plurality of FD frame periods, and may be the time T including the target pixel, for example, a plurality of pixel periods. As the modification of the third embodiment, the number of pulse signal waveforms received and appearing within the determination target period may be determined. That is, the controller 100 determines whether the peak time difference between a certain number (for example, 3) or more pulse signal waveforms within the determination target period is equal to or less than the threshold value for each pixel at a target position for the output signal from the single BSE detector. The number related to the number of waveforms can also be set by design, user setting, or the like as one piece of determination reference information.

Fourth Embodiment

Figure 21:
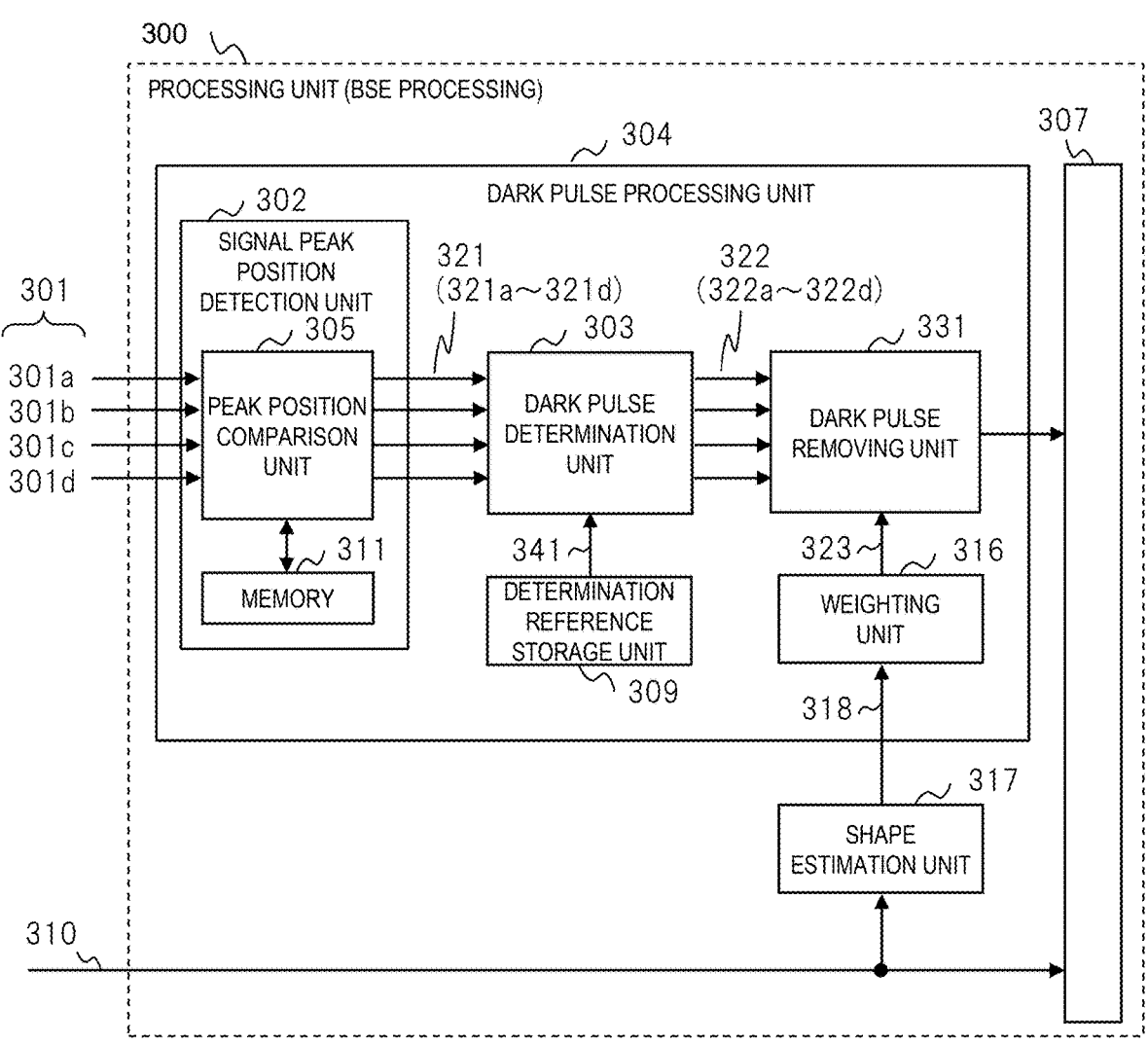
FIG. 21 shows a configuration example of a processing unit in a fourth embodiment.

Charged particle beam apparatus according to a fourth embodiment will be described with reference to FIG. 21 and subsequent drawings. The fourth embodiment can be implemented based on any of the first embodiment and the second embodiment each including BSE detectors of a plurality of channels, and has a feature added to or corrected from the first embodiment and the second embodiment. In the fourth embodiment, regarding discrimination between a BSE signal and a dark pulse, not only a signal from a BSE detection system but also a signal from an SE detection system is referred to as an auxiliary and reflected as a correction, thereby improving accuracy. In the fourth embodiment, based on the first embodiment, an example of using both a determination method using a single frame in the first embodiment and a determination method using a plurality of frames in the second embodiment will be described.
Processing Unit FIG. 21 shows a configuration example of the processing unit 300 of the controller 100 in the fourth embodiment. The configuration in FIG. 21 differs from that in the first embodiment mainly in that a shape estimation unit 317 is added to the processing unit 300, and a weighting unit 316 is added to the dark pulse processing unit 304.

Figure 10:
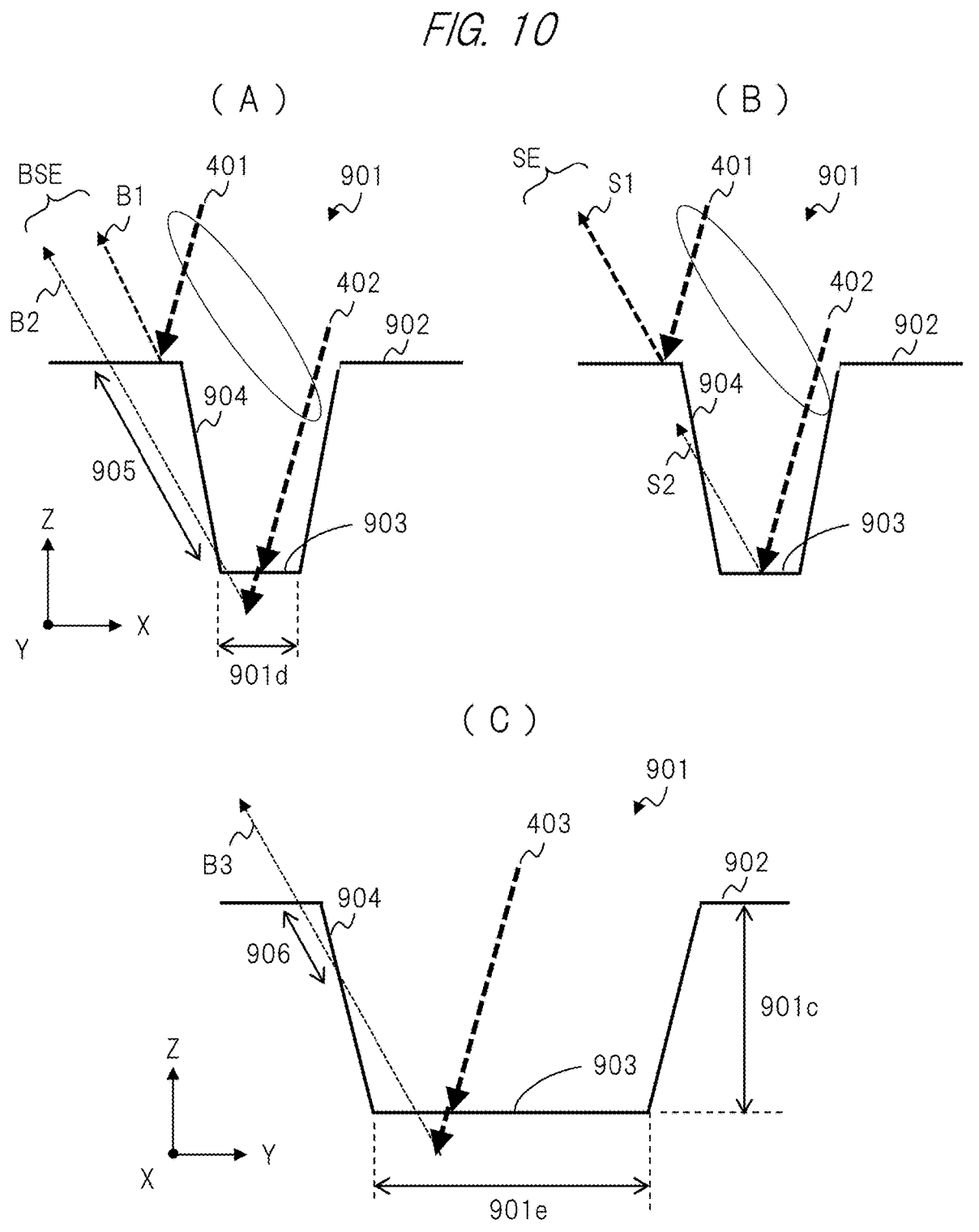

In the fourth embodiment, the SE detection signal 310 output from the SE detector 115 in FIG. 2 through the SE detection circuit 116 is input to the shape estimation unit 317. The shape estimation unit 317 estimates a position and shape of a structure on the surface of the sample 3 based on the SE detection signal 310. As shown in FIG. 10 described above, since the easiness of detection of secondary electrons differs between the upper surface 902 and the deep groove structure 901, for example, the position and shape of the structure can be estimated based on the SE detection signal 310, for example, based on a difference in luminance. For example, as shown in FIG. 9A, the shape of an opening of the deep groove structure 901 on the upper surface 902 of the sample 3 can be estimated to be substantially rectangular, and a dimension of a long side and a short side, a dimension of the depth 901*c*, and the like can also be estimated. The shape estimation unit 317 outputs a signal 318 indicating the estimated shape or the like.

The weighting unit 316 weights, based on the signal 318, the number of BSE signals obtained between the same pixels in the signals 301 (301*a* to 301*d*) from BSE detection systems of four channels. This improves a determination rate of a dark pulse. The weighting unit 316 outputs a signal 323 indicating the weighting. The dark pulse removing unit 331 corrects determination result signals 322 from the dark pulse determination unit 303 based on a weighting value of the signal 323. The dark pulse removing unit 331 removes the dark pulse based on the corrected result.

As shown in FIG. 10 described above, the number of secondary electrons obtained from a hole or groove structure of the sample 3, for example, a bottom is small, whereas the number of secondary electrons obtained from the sample surface is larger than the number of back scattered electrons. Therefore, where the hole or groove structure is present on the sample surface can be estimated and determined using the SE detection signal.

In this case, for a pixel related to the specified structure, the BSE signal and the dark pulse are discriminated using a determination target period of a plurality of FD frames shown in the second embodiment, and for other pixels corresponding to sample surface positions other than the specified structure, the BSE signal and the dark pulse are discriminated using a single frame determination target period shown in the first embodiment. This is effective in reducing a processing time and reducing a capacity of a necessary storage resource (for example, a memory in the peak position storage unit 312).

A method for improving the accuracy of discrimination based on a structure specification will be described with reference to FIGS. 21 and 22. In FIG. 21, signals 321 (321a to 321d) such as a peak position of a pulse signal included in each pixel based on the signals 301 (301a to 301d) from the four channels is input to the dark pulse determination unit 303 from the peak position comparison unit 305 of the signal peak position detection unit 302. In the dark pulse determination unit 303, the BSE signal and the dark pulse are discriminated by comparing the peak time difference with the determination reference value α in the same manner as the determination method in the first embodiment or the second embodiment.

The signals 322 (322a to 322d) from the channels as a discrimination result are input to the dark pulse removing unit 331. Here, the dark pulse removing unit 331 uses the weighted signal 323 from the weighting unit 316 to correct the number of BSE signals by weighting the discrimination result, and adjusts a ratio of the number of BSE signals to the number of dark pulses for each channel. The weighting is determined based on detection sensitivity in each channel according to the structure of the sample 3.

Figures 22, 23:
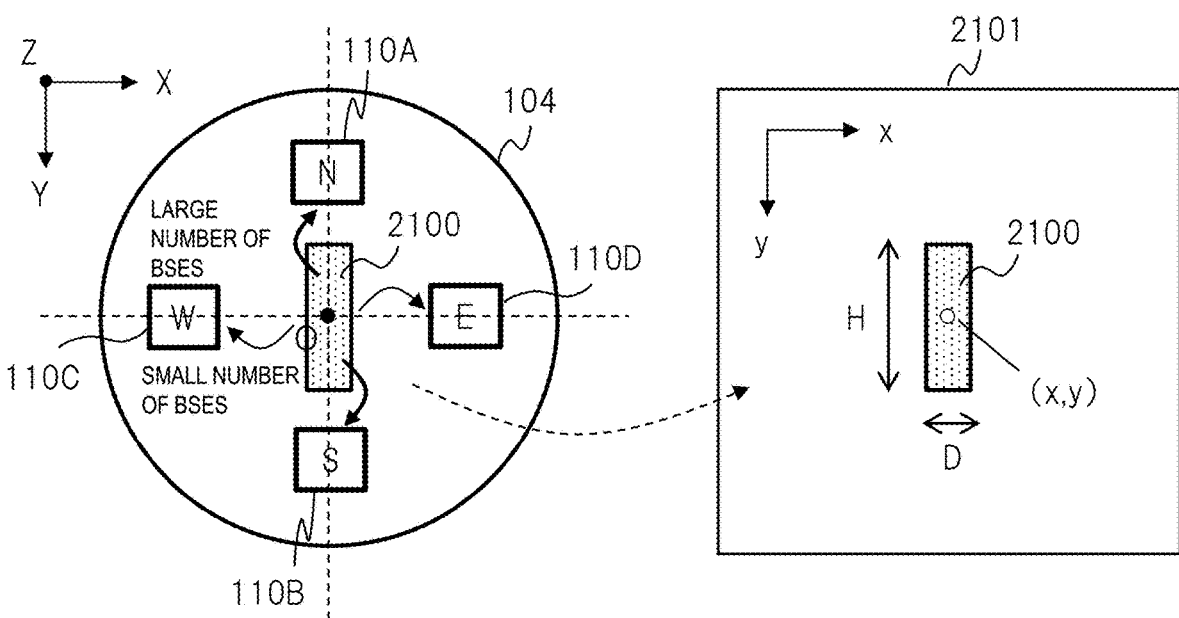
FIG. 22 shows a relationship between an example structure on a sample surface and BSE detectors of four channels in the fourth embodiment.
FIG. 23 shows an example of a detection proportion in the BSE detectors of the four channels according to an aspect ratio of the structure in the fourth embodiment.

FIGS. 22 and 23 are schematic explanatory diagrams showing the weighting. FIG. 22 shows an example of a position and a shape of a structure 2100 such as a deep groove structure on the surface of the sample 3 and an arrangement relationship of the BSE detectors 110 (110A to 110D) of the four channels with respect to the structure 2100. In FIG. 22, the structure 2100 present at a position of a center point O corresponding to a beam optical axis is shown in an enlarged manner as a schematic explanatory diagram on an X-Y plane, and as shown on a right side, it may be regarded as having a detection image 2101 as a top-view image similar to that on a left side.

In the present example, similarly to the deep groove structure 901 in FIG. 9, the structure 2100 has a substantially rectangular shape and has a depth to a bottom. An opening of the structure 2100 has a short side in the X direction and a long side in the Y direction. Here, D is a length of the short side, and H is a length of the long side. A position of the structure 2100 can be represented by position coordinates (x, y) in a coordinate system of the sample 3, for example. Various coordinate systems such as a coordinate system of the sample 3, a coordinate system of a stage, and a coordinate system of a detection image have a correspondence relationship and can be appropriately converted.

In the present example, the long side of the structure 2100 extends along the Y axis. In a direction of the Y axis, the BSE detector 110A serving as the first channel ch1 (north) is disposed at a position on one side (an upper side in FIG. 22) with respect to the center point O, and the BSE detector 110B serving as the second channel ch2 (south) is disposed at a position on the other side (a lower side in FIG. 22). The BSE detector 110C serving as the third channel ch3 (west) and the BSE detector 110D serving as the fourth channel ch4 (east) are disposed in a direction of the X axis along which the short side extends.

As shown in FIG. 10 described above, there is a relationship that a relatively large number of back scattered electrons are emitted in the direction of the long side of the deep groove structure 901, whereas the number of emitted back scattered electrons is relatively small in the direction of the short side of the deep groove structure 901. Such a relationship can be expressed using D/H as an aspect ratio of the structure 2100. In the present example, the aspect ratio parameter is a ratio with the length H of the long side in the Y direction being a denominator and the length D of the short side in the X direction being a numerator. It can be said that, as the shape of the structure 2100, the longer the side in the Y direction and the smaller the value of D/H with respect to 1, the higher the BSE detection sensitivity of the BSE detectors 110A and 110B disposed on the Y axis.

Therefore, in the fourth embodiment, the BSE detection sensitivity is corrected by weighting based on the position and shape of the structure 2100 as described above and the arrangement relationship of the BSE detectors 110 of each channel with respect to the structure 2100. Specifically, the correction by weighting is not a correction by weighting in the BSE detection system itself, including the BSE detectors 110, or in the determination of the dark pulse determination unit 303 itself, but a correction by weighting on the determination result.

A table in FIG. 23 shows an example of proportions of the number of BSEs that are emitted in four directions of north, south, east, and west of the BSE detectors 110 of the four channels and received by each BSE detector 110 for the structure 2100. In the present example, the smaller the value of D/H, the longer the structure 2100 extends in the Y direction, and the higher the proportion of the BSEs received by the BSE detectors 110A and 110B disposed in the Y direction. On the other hand, the larger the value of D/H, the longer the structure 2100 extends in the X direction, and the higher the proportion of the BSE received by the BSEs detectors 110C and 110D disposed in the Y direction. When the D/H is close to 1, the lengths in the X direction and the Y direction are approximately the same, and the proportions of the BSEs received by the BSE detectors 110 of the channels are approximately the same.

As an example, for the shape of the structure 2100, in the case of D/H=0.6, the proportions of the BSEs received by the BSE detector 110A in the north and the BSE detector 110B in the south in the Y direction are 0.4, and the proportions of the BSEs received by the BSE detector 110D in the east and the BSE detector 110C in the west in the X direction are 0.1. Taking the whole as 1, 0.4+0.1+0.1+0.4=1. In the table in FIG. 23, the proportions of the BSEs received by each of BSE detectors 110 at N, E, W, and S are shown in the row where D/H is "0.5 to 0.7".

The proportion of the BSEs received by each channel, in other words, the detection sensitivity can be expressed by a probability as another expression. For example, in the case of D/H=0.6, the probabilities of the BSEs received by the BSE detectors 110 at N, E, W, and S can be expressed as {40%, 10%, 10%, 40%}. The proportions shown in the table in FIG. 23 may be set in advance as data of the table.

As in the above example, the shape estimation unit 317 estimates the position and shape of the structure 2100 based on the SE detection signal, and the weighting unit 316 assumes the detection proportion of the BSEs in each channel and the detection sensitivity based on the estimation result. The weighting unit 316 may refer to the proportion in each channel from the table in FIG. 23 based on the value of D/H, for example, or may calculate the proportion each time. The weighting unit 316 decides weighting for correcting the determination result in each channel in the determination result signals 322 (322a to 322d) based on the proportion in each channel.

As a method for determining the weighting, for example, the following can be applied. The determination result signals 322 (322a to 322d) from the dark pulse determination unit 303 include information on the estimation and determination result as to whether the included pulse signals are a BSE signal or a dark pulse for each channel. Weighting is decided such that the proportions in the signals 322a and 322b corresponding to the BSE detectors 110A and 110B in the Y direction (N, S) approach 0.4 and the proportions in the signals 322c and 322d corresponding to the BSE detectors 110C and 110D in the X direction (W, E) approach 0.1, and the signals are output as the signal 323. The dark pulse removing unit 331 corrects the number of BSE signals by redetermining whether the pulse signals determined to be the BSE signals in the determination result signals 322 (322a to 322d) are the BSE signal or the dark pulse, according to the weighted signal 323.

In the present embodiment, the dark pulse removing unit 331 performs the redetermination according to the weighting. However, the invention is not limited thereto. A functional block for the redetermination according to the weighting may be provided in the dark pulse determination unit 303, or the functional block may be provided between the dark pulse determination unit 303 and the dark pulse removing unit 331.

In the example in FIG. 22, the detection proportion is estimated assuming that the four BSE detectors are at equal distances with respect to the position of the structure 2100. However, the invention is not limited thereto. When the four BSE detectors are at different distances with respect to the position of the structure 2100, the detection proportion may be varied according to the distance. That is, the closer the distance is, the higher the detection proportion may be.

In the example in FIG. 22, the detection proportion is assumed with a beam incidence direction with respect to the structure 2100 as the Z direction, which is perpendicular to the plane. However, the invention is not limited thereto. When a beam is incident on the structure 2100 from an oblique direction, the detection proportion may be varied depending on the oblique direction. Examples of the case where the beam is incident on the structure 2100 from the oblique direction include a case where a beam optical axis is in a tilt direction and a case where a beam scanning direction is considered.

FIG. 24 shows a specific example of the redetermination and correction using the above weighting, which is as follows. For example, as shown in the table in FIG. 24, for a certain target pixel period, the number of pulse signals determined to be the BSE signal in the first channel ch1 (north) is AS and the number of pulse signals determined to be the dark pulse is AD as the determination result of the dark pulse determination unit 303. Similarly, the number of pulse signals determined to be the BSE signal is BS and the number of pulse signals determined to be the dark pulse is BD in the second channel ch2 (south), the number of pulse signals determined to be the BSE signal is CS and the number of pulse signals determined to be the dark pulse is CD in the third channel ch3 (west), and the number of pulse signals determined to be the BSE signal is DS and the number of pulse signals determined to be the dark pulse is DD in the fourth channel ch4 (east).

For the BSE determination result, a ratio of AS:BS:CS:DS is assumed to be different from, for example, a ratio of the above-described proportions of 0.4:0.1:0.1:0.4. In this case, the dark pulse processing unit 304 performs correction such that the ratio of AS:BS:CS:DS approaches the proportion of 0.4:0.1:0.1:0.4 by redetermining part of the pulse signals (AD, BD, CD, DD) that are determined to be the dark pulse as the BSE signal.

As an example, the number of BSE signals is AS=2, BS=0, CS=1, and DS=2, the ratio of the BSE signals is 0.2:0:0.1:0.2, and the number of dark pulses is AD=3, BD=3, CD=4, and DD=1. In this case, redetermination is performed such that the number of BSE signals is increased to AS=2+2=4, BS=0+1=1, CS=1+0=1, and DS=2+1=3, the number of dark pulses is decreased to AD=3−2=1, BD=3−1=2, CD=4−0=4, and DD=1−1=0, and some of the pulse signals that are determined to be the dark pulse is transferred as the BSE signal. In the redetermination, the correction by weighting is performed such that the ratio of AS:BS:CS:DS approaches the detection proportion of the BSEs {0.4:0.1:0.1:0.4}. The ratio of the BSE signals before correction is AS:BS:CS:DS={0.2:0:0.1:0.2}, and the ratio of the BSE signals after correction is, for example, {0.4:0.1:0.1:0.3}, and approaches the detection proportion of the BSEs {0.4:0.1:0.1:0.4}.

As described above, in the fourth embodiment, in consideration of the detection proportion of the BSEs in each channel according to the three-dimensional structure of the sample 3, it is assumed that the determination result of the discrimination between the BSE signal and the dark pulse is naturally close to the proportion, and the correction by weighting is performed on the determination result.

Processing Flow

Figure 25:
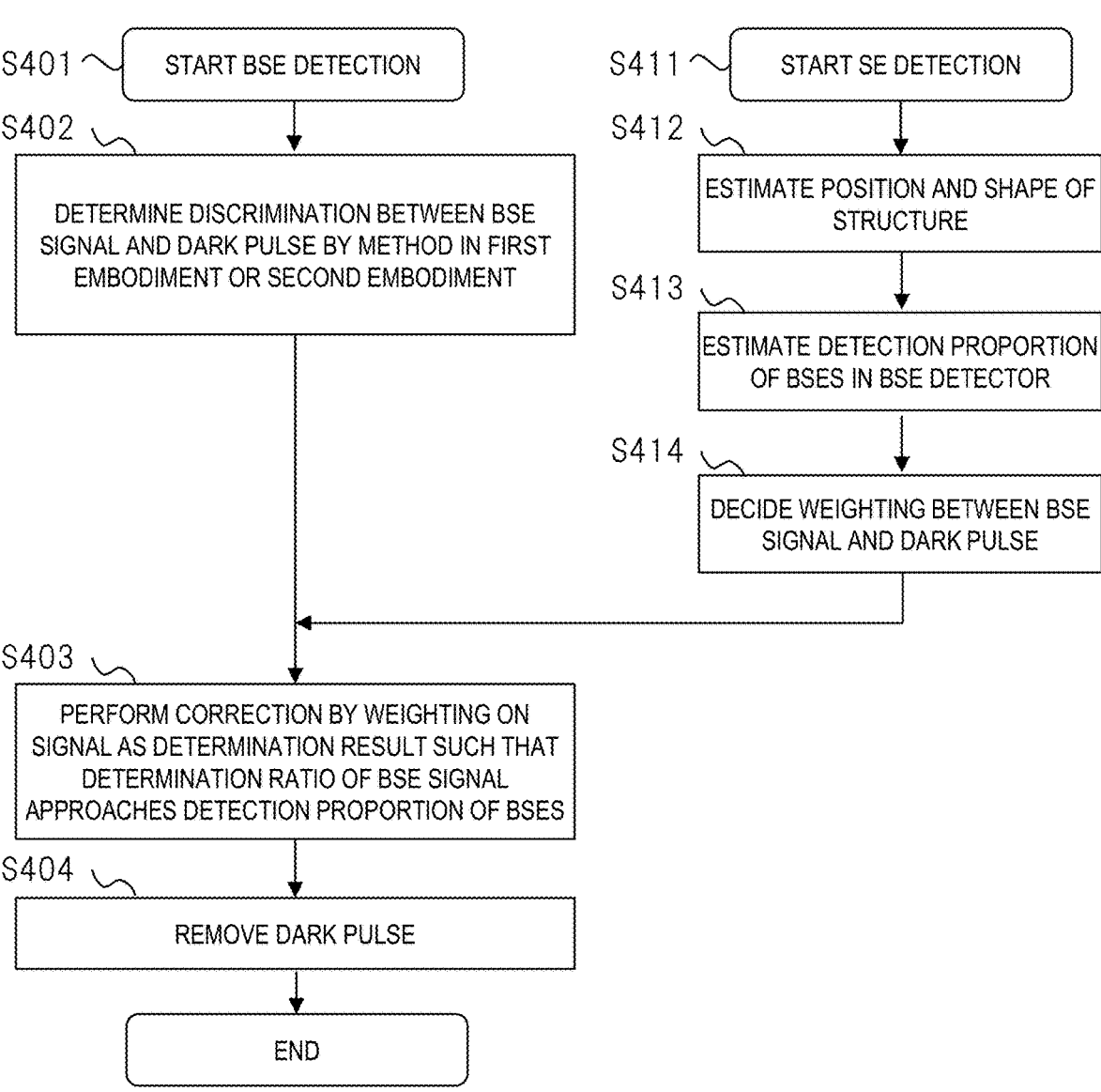
FIG. 25 shows a processing flow of a controller in the fourth embodiment.

FIG. 25 shows a processing flow in the fourth embodiment. The present flow is based on the flow in the first embodiment or the second embodiment, and step S411 or the like related to the SE detection system are added. Step S401 and step S402 are the same as those in the flow in the first embodiment or the second embodiment, and thus the detailed description thereof will be omitted. In step S401, the BSE detection using the BSE detectors 110 of the four channels is started for the target sample 3.

In step S402, the controller 100 performs determination for the discrimination between the BSE signal and the dark pulse for each target pixel using the method described in the first embodiment or the second embodiment. At this time, as an example of selective use of the method, as described above, the method in the first embodiment is applied when the front surface of the sample 3 is a target, and the method in the second embodiment is applied when a deep groove structure or the like is a target. The invention is not limited thereto, and as a modification, only one of the methods in the first embodiment and the second embodiment may be applied properly.

On the other hand, steps S411 to S414 can be performed temporally in parallel with steps S401 to S402. In step S411, the controller 100 starts SE detection using the SE detector 115 for the target sample 3. In step S412, the controller 100 estimates the position and the shape of a hole or groove structure on the surface of the sample 3 as in the shape estimation unit 317 described above. In step S413, the controller 100 estimates the detection proportions of the BSEs in the BSE detectors 110 of the four channels according to the estimated structure as in FIGS. 22 and 23 described above. In step S414, the controller 100 decides the weighting of the BSE signal and the dark pulse based on the estimated proportion. Weighting information is, for example, information indicating an increase or decrease in the number of BSE signals or dark pulses for each channel.

On the other hand, in step S403, the controller 100 performs correction by weighting on the determination result signal in step S402 such that the ratio of the BSE signal determination approaches the detection proportion of the BSEs as in FIG. 24 described above. The correction by weighting is redetermination that part of the number of dark pulses is transferred as the number of BSE signals as in the above example.

In step S404, similarly to the first embodiment, the controller 100 removes the dark pulse based on the determination result reflecting the above correction. Thereafter, although not described, imaging of the detection signal is performed in the same manner as described above.

Effects According to Fourth Embodiment

As described above, in the fourth embodiment, the detection signals from the SE detection systems are used to estimate the detection proportion of the the the BSE signals based on the relationship between the structure of the sample 3 and the BSE detectors of the plurality of channels, and the determination result is corrected by the weighting. Accordingly, according to the fourth embodiment, the accuracy of discrimination between the BSE signal and the dark pulse can be improved, and the S/N of the acquired image can be improved.

GUI Example

FIG. 26 shows a screen display example of the GUI 500 in FIG. 8 applicable to each embodiment. The screen in FIG. 26 includes a setting value column 2601 and an output value column 2602. In the setting value column 2601, various setting values handled in the embodiment are displayed. The user can check the setting value on the screen, and can input and change the setting value as necessary. In the present example, as the BSE and dark pulse determination reference value, the above-described determination reference value α which is a threshold value of the peak time difference, the above-described first number N1 which is the number of BSE determination channels, and the above-described determination frame number FD related to the determination target period are displayed. The determination reference value α can be set for each channel.

In the output value column 2602, the S/N value before dark pulse removal and the S/N value after dark pulse removal are displayed in comparison with each other. An image obtained when there is no signal, an acquired image of a pattern image, and the like are displayed. The acquired image may be displayed by being selected from the detection image before the dark pulse removal and the detection image after the dark pulse removal, or may be displayed in parallel. The screen display data is not limited thereto.

APPENDIX

The first embodiment to the fourth embodiment have described an example in which the invention is applied to the SEM. However, the invention is not limited thereto, and the invention can be similarly applied to an inspection apparatus system using X-rays, such as computed tomography (CT) apparatus.

Although the processor system, which is the controller 100 of the charged particle beam apparatus in each embodiment, has been described as a processor system provided in the SEM, the invention is not limited thereto, and the processor system may be a processor system separate from the charged particle beam apparatus such as an SEM. The processor system may refer to and acquire data and information corresponding to the BSE detection signal or the like from apparatus such as an SEM via communication or a storage medium, and execute the same processing.

The method such as a semiconductor measuring method corresponding to the charged particle beam apparatus in each embodiment, in other words, the back scattered electron detection processing method or the dark pulse detection processing method can be implemented as follows, for example. The method corresponding to the first embodiment is a method including a step executed in charged particle beam apparatus including a controller and a plurality of BSE detectors configured to detect BSEs from a sample. The method includes: in order to determine whether a first peak included in an output signal from a first BSE detector among the plurality of BSE detectors is caused by a BSE or a dark pulse, a step in which the controller acquires a first peak time of the first peak within a period, a step in which the controller acquires, within the period, a second peak time of a second peak included in an output signal from a second BSE detector other than the first BSE detector among the plurality of BSE detectors, and a step in which the controller determines, when the second peak is present where a time difference between the first peak time and the second peak time is within a threshold value, that the first peak is caused by the BSE, and determines, when the second peak is not present where the time difference between the first peak time and the second peak time is within the threshold value, that the first peak is caused by the dark pulse.

As a program corresponding to the apparatus and method in each embodiment, a computer program for implementing the processor system, which is a controller of charged particle beam apparatus, can be implemented as a program for causing a processor to execute processing corresponding to each step in the method, for example. Data corresponding to the program in the embodiment may be provided in a form stored in a non-transient computer-readable storage medium.

Although the embodiments of the disclosure have been specifically described, the disclosure is not limited to the embodiments described above and can be variously modified without departing from a scope. Except for essential components, the components according to the embodiments may be added, deleted, replaced, or the like. Unless otherwise limited, each component may be singular or plural. In addition, an embodiment combining the embodiments is also possible.

What is claimed is:

1. Charged particle beam apparatus comprising:
a plurality of back scattered electron (BSE) detectors configured to detect a BSE from a sample; and
a controller, wherein
in order to determine whether a first peak included in an output signal from a first BSE detector among the plurality of BSE detectors is caused by a BSE or a dark pulse, the controller acquires a first peak time of the first peak within a period, acquires, within the period, a second peak time of a second peak included in an output signal from a second BSE detector other than the first BSE detector among the plurality of BSE detectors, determines, when the second peak is present where a time difference between the first peak time and the second peak time is within a threshold value, that the first peak is caused by the BSE, and determines, when the second peak is not present where the time difference between the first peak time and the second peak time is within the threshold value, that the first peak is caused by the dark pulse.

2. Charged particle beam apparatus comprising:

a first back scattered electron (BSE) detector configured to detect a BSE from a sample; and a controller, wherein in order to determine whether a first peak included in an output signal from the first BSE detector is caused by a BSE or a dark pulse, the controller identifies a first pixel in a first frame corresponding to the first peak within a period of a plurality of frames as a period for the output signal from the first BSE detector, and selects a first sub signal including a first peak time corresponding to the first pixel, identifies, within the period, a second pixel at a pixel position same as that of the first pixel in a second frame different from the first frame, and selects a second sub signal including a second peak time corresponding to the second pixel, determines, when the second sub signal is present where a time difference between the first peak time of the first sub signal and the second peak time of the second sub signal is within a threshold value, that the first peak is caused by the BSE, and determines, when the second sub signal is not present where the time difference between the first peak time of the first sub signal and the second peak time of the second sub signal is within the threshold value, that the first peak is caused by the dark pulse.

3. The charged particle beam apparatus according to claim 1, wherein the controller determines, when a condition that the time difference between peaks is within the threshold value in detection signals from a first number (N1) or more BSE detectors among the plurality of BSE detectors is satisfied within the period, that a peak satisfying the condition is caused by the BSE.

4. The charged particle beam apparatus according to claim 1, wherein the controller identifies a first pixel in a first frame corresponding to the first peak within a period of a plurality of frames as the period for output signals from the plurality of BSE detectors, and selects a first sub signal including a first peak time corresponding to the first pixel, identifies, within the period, a second pixel at a pixel position same as that of the first pixel in a second frame different from the first frame, and selects a second sub signal including a second peak time corresponding to the second pixel, determines, when the second sub signal is present where a time difference between the first peak time of the first sub signal and the second peak time of the second sub signal is within a threshold value, that the first peak is caused by the BSE, and determines, when the second sub signal is not present where the time difference between the first peak time of the first sub signal and the second peak time of the second sub signal is within the threshold value, that the first peak is caused by the dark pulse.

5. The charged particle beam apparatus according to claim 1, further comprising:

a secondary electron (SE) detector configured to detect an SE from the sample, wherein the controller estimates a position and a shape of a structure on the sample based on an output signal from the SE detector, estimates a probability of BSE reception in each of the plurality of BSE detectors based on the position and the shape of the structure, determines whether the first peak is caused by the BSE or the dark pulse based on an output signal from the first BSE detector corresponding to the position of the structure, and performs a correction by weighting according to the probability in the determination.

6. The charged particle beam apparatus according to claim 5, wherein the controller estimates an aspect ratio of the structure, and decides the weighting according to the probability according to the aspect ratio and an arrangement relationship between the structure and the plurality of BSE detectors.

7. The charged particle beam apparatus according to claim 1, wherein the controller removes, based on a result of the determination, a portion determined as the dark pulse in the output signal.

8. The charged particle beam apparatus according to claim 1, wherein the controller calculates a signal-to-noise (S/N) ratio of the output signal from the first BSE detector based on the result of the determination, and sets the threshold value again and makes a redetermination when an S/N value is less than a target value.

9. A processor system comprising:

one or more processors; and a memory, wherein the processor system refers to output signals from a plurality of back scattered electron (BSE) detectors configured to detect a BSE from a sample, and in order to determine whether a first peak included in an output signal from a first BSE detector among the plurality of BSE detectors is caused by a BSE or a dark pulse, acquires a first peak time of the first peak within a period, acquires, within the period, a second peak time of a second peak included in an output signal from a second BSE detector other than the first BSE detector among the plurality of BSE detectors, determines, when the second peak is present where a time difference between the first peak time and the second peak time is within a threshold value, that the first peak is caused by the BSE, and determines, when the second peak is not present where the time difference between the first peak time and the second peak time is within the threshold value, that the first peak is caused by the dark pulse.

\* \* \* \* \*